US006743289B2

(12) United States Patent
Falster et al.

(10) Patent No.: US 6,743,289 B2
(45) Date of Patent: Jun. 1, 2004

(54) THERMAL ANNEALING PROCESS FOR PRODUCING LOW DEFECT DENSITY SINGLE CRYSTAL SILICON

(75) Inventors: Robert J. Falster, London (GB); Martin Jeffrey Binns, St. Charles, MO (US); Alan Wang, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 10/073,506

(22) Filed: Feb. 11, 2002

(65) Prior Publication Data

US 2002/0083889 A1 Jul. 4, 2002

Related U.S. Application Data

(62) Division of application No. 09/416,998, filed on Oct. 13, 1999, now Pat. No. 6,416,836.
(60) Provisional application No. 60/104,304, filed on Oct. 14, 1998.

(51) Int. Cl.[7] .............................................. C30B 31/00
(52) U.S. Cl. ...................... 117/2; 117/3; 117/13; 117/15
(58) Field of Search ............................ 117/2, 3, 13, 15

(56) References Cited

U.S. PATENT DOCUMENTS

| 4,314,595 A |   | 2/1982  | Yamamoto et al. |         |
|-------------|---|---------|-----------------|---------|
| 4,376,657 A |   | 3/1983  | Nagasawa et al. |         |
| 4,437,922 A |   | 3/1984  | Bischoff et al. |         |
| 4,505,759 A |   | 3/1985  | O'Mara          |         |
| 4,548,654 A | * | 10/1985 | Tobin et al.    | 148/1.5 |
| 4,851,358 A |   | 7/1989  | Huber           |         |
| 4,868,133 A |   | 9/1989  | Huber           |         |
| 4,981,549 A |   | 1/1991  | Yamashita et al.|         |
| 5,264,189 A |   | 11/1993 | Yamashita et al.|         |
| 5,327,007 A |   | 7/1994  | Imura et al.    |         |

(List continued on next page.)

FOREIGN PATENT DOCUMENTS

| DE | 39 05 626 A1  | 8/1989 |
| DE | 43 23 964 A1  | 1/1994 |
| DE | 44 14 947 A1  | 8/1995 |
| DE | 198 06 045 A1 | 8/1998 |
| EP | 0 503 816 B1  | 9/1992 |
| EP | 0 504 837 A2  | 9/1992 |
| EP | 0 536 958 A1  | 4/1993 |
| EP | 0 716 168 A1  | 6/1996 |

(List continued on next page.)

OTHER PUBLICATIONS

Wolf et al., Silicon Procewssing for the VLSI Era, vol. 1.: Process Technology, Chapter 2, Lattice Press, Sunset Beach, CA, USA, pp. 36–72, 1986.*

De Kock, A.J.R., "Point Defect Condensation in Dislocation–Free Silicon Crystals", Semiconductor Silicon, 1977, pp. 508–520.

(List continued on next page.)

Primary Examiner—Nadine G. Norton
Assistant Examiner—Matthew Anderson
(74) Attorney, Agent, or Firm—Senniger, Powers, Leavitt & Roedel

(57) ABSTRACT

A thermal annealing process for producing a low defect density single crystal silicon wafer. The process includes thermally annealing a wafer having a first axially symmetric region which extends radially inwardly from the circumferential edge, contains silicon self-interstitials as the predominant intrinsic point defect and is substantially free of agglomerated interstitial defects and a second axially symmetric region which has vacancies as the predominant intrinsic point defect. The wafer is subjected to a thermal anneal at a temperature in excess of about 1000° C. in an atmosphere of hydrogen, argon or a mixture thereof to dissolve agglomerated vacancy defects present in the second axially symmetric region within a layer extending from the front side toward the central plane.

54 Claims, 30 Drawing Sheets

U.S. PATENT DOCUMENTS

| | | | |
|---|---|---|---|
| 5,385,115 A | * | 1/1995 | Tomioka et al. ............... 117/2 |
| 5,401,669 A | | 3/1995 | Falster et al. |
| 5,403,406 A | * | 4/1995 | Falster et al. ............. 148/33.2 |
| 5,445,975 A | | 8/1995 | Gardner et al. |
| 5,474,020 A | | 12/1995 | Bell et al. |
| 5,485,803 A | | 1/1996 | Habu |
| 5,487,354 A | | 1/1996 | von Ammon et al. |
| 5,502,010 A | | 3/1996 | Nadahara et al. |
| 5,502,331 A | | 3/1996 | Inoue et al. |
| 5,534,294 A | | 7/1996 | Kubota et al. |
| 5,539,245 A | | 7/1996 | Imura et al. |
| 5,593,494 A | | 1/1997 | Falster |
| 5,611,855 A | | 3/1997 | Wijaranakula |
| 5,667,584 A | | 9/1997 | Takano et al. |
| 5,674,756 A | | 10/1997 | Satoh et al. |
| 5,704,973 A | | 1/1998 | Sakurada et al. |
| 5,728,211 A | | 3/1998 | Takano et al. |
| 5,738,942 A | | 4/1998 | Kubota et al. |
| 5,788,763 A | * | 8/1998 | Hayashi et al. ................ 117/2 |
| 5,919,302 A | * | 7/1999 | Falster et al. .................. 117/3 |
| 5,935,320 A | * | 8/1999 | Graef et al. .................... 117/2 |
| 5,939,770 A | | 8/1999 | Kageyama |
| 5,942,032 A | | 8/1999 | Kim et al. |
| 5,944,889 A | | 8/1999 | Park et al. |
| 5,954,873 A | | 9/1999 | Hourai et al. |
| 5,968,262 A | | 10/1999 | Saishouji et al. |
| 5,968,264 A | | 10/1999 | Lida et al. |
| 5,994,761 A | * | 11/1999 | Falster et al. ............... 257/611 |
| 6,045,610 A | * | 4/2000 | Park et al. .................... 117/13 |
| 6,053,974 A | | 4/2000 | Luter et al. |
| 6,093,913 A | | 7/2000 | Schrenker et al. |
| 6,129,787 A | * | 10/2000 | Adachi et al. ................ 117/89 |
| 6,139,625 A | * | 10/2000 | Tamatsuka et al. ........... 117/19 |
| 6,153,008 A | | 11/2000 | von Ammon et al. |
| 6,190,631 B1 | | 2/2001 | Falster |
| 6,191,009 B1 | * | 2/2001 | Tamatsuka et al. ......... 438/471 |
| 6,204,188 B1 | * | 3/2001 | Abe et al. .................... 438/706 |
| 6,206,961 B1 | * | 3/2001 | Takeno et al. ................ 117/20 |
| 6,228,164 B1 | * | 5/2001 | Ammon et al. ............... 117/19 |
| 6,236,104 B1 | * | 5/2001 | Falster ....................... 257/618 |
| 6,238,990 B1 | * | 5/2001 | Aga et al. .................... 438/308 |
| 6,245,311 B1 | * | 6/2001 | Kobayashi et al. ......... 423/348 |
| 6,254,672 B1 | | 7/2001 | Falster et al. |
| 6,261,361 B1 | * | 7/2001 | Iida et al. ...................... 117/19 |
| 6,287,380 B1 | * | 9/2001 | Falster et al. ................. 117/13 |
| 6,334,896 B1 | * | 1/2002 | Iida et al. ...................... 117/20 |
| 6,409,827 B2 | * | 6/2002 | Falster et al. ................. 117/15 |
| 6,413,310 B1 | * | 7/2002 | Tamatsuhka et al. .......... 117/3 |

FOREIGN PATENT DOCUMENTS

| | | |
|---|---|---|
| EP | 0 747 513 A2 | 12/1996 |
| EP | 0 799 913 A1 | 10/1997 |
| EP | 0 890 662 | 1/1999 |
| EP | 0 909 840 | 4/1999 |
| EP | 0 962 557 A1 | 5/1999 |
| EP | 0 962 556 A1 | 8/1999 |
| GB | 2 137 524 A | 10/1984 |
| GB | 2182 262 A | 5/1987 |
| JP | 2-180789 | 7/1990 |
| JP | Hei 3-93700 | 4/1991 |
| JP | 4-108682 | 4/1992 |
| JP | Hei 7-041383 | 2/1995 |
| JP | Hei 7-206591 | 8/1995 |
| JP | 7321120 | 12/1995 |
| JP | 7335657 | 12/1995 |
| JP | 8045944 | 2/1996 |
| JP | 8-045945 | 2/1996 |
| JP | 8045947 | 2/1996 |
| JP | Hei 8-208374 | 8/1996 |
| JP | HO 8-268794 | 10/1996 |
| JP | 8-330316 | 12/1996 |
| JP | 9-199416 | 7/1997 |
| JP | 9-202690 | 8/1997 |
| JP | 11-150119 A | 6/1999 |
| JP | 11-157995 A | 6/1999 |
| JP | 11-180800 A | 7/1999 |
| JP | 11-189495 A | 7/1999 |
| JP | 11-199386 A | 7/1999 |
| JP | 11-199387 A | 7/1999 |
| WO | WO 97/26393 | 7/1997 |
| WO | WO 98/45507 | 10/1998 |
| WO | WO 98/45508 | 10/1998 |
| WO | WO 98/45509 | 10/1998 |
| WO | WO 98/45510 | 10/1998 |

OTHER PUBLICATIONS

Park, J.G., et al., "Nature of D–Defect in CZ Silicon: D–Defect Dissolution and D–Defect Related T.D.D.B.", Material Science Forum, vol.s. 196–201, 1995, pp. 1697–1706.

Takano, K., et al., "Relationship Between Grown–in Defects and Thermal History During CZ Si Crystal Growth", Materials Science Forum, vols. 196–201, 1995, pp. 1707–1712.

Yamagishi, et al., "Recognition of D Defects in Silicon Signle Crystals by Preferential Etching and Effect on Gate Oxide Integrity,", Semicond. Sci Technol. 7, 1992, A135–A140.

Yamauchi, et al., "Application of Copper–Decoration Method to Characterize As–Grwon Czochralski–Silicon", Jpn. J. Appl. Phys., vol. 31, 1992, pp. L439–L442.

Abe, et al., "Defect–Free Surfaces of Bulk Wafers by Combination of RTA and Crystal Growth", (publication information unknown).

Abe, et al., "Innovated Silicon Crystal Growth and Wafering Technologies", Electrochemical Society Proceedings, vol. 97, No. 3, pp. 123–133.

Abe, T., et al., "Behavior of Point Defects in FZ Silicon Crystals", Semiconductor Silicon 1990, *Proceedings of the Sixth International Symposium on Silicon Materials Science and Technology,* vol. 90–7 (1990), pp. 105–116.

De Kock, A.J.R.,"The Elimination of Vacancy–Cluster Formation in Dislocation–Free Silicon Crystals", J. of the Electrochem. Soc.: Solid–State Science and Technology, vol. 118, No. 11, (Nov. 1971), pp. 1851–1856.

De Kock, A.J.R., et al., "Effect of Growth Parameters on Formation and Elimination of Vacancy Clusters in Dislocation–Free Silicon Crystals", Journal of Crystal Growth, vol. 22 (1974), pp. 311–320.

De Kock, A.J.R., "Point Defect Condensation in Dislocation–Free Silicon Crystals", Semiconductor Silicon, 1977, pp. 508–520.

De Kock, et al., "The Effect of Doping on the Formation of Swirl Defects in Dislocation–Free Czochralski–Grown Silicon crystals", Journal of Crystal Growth, vol. 49, pp. 718–734 (1980).

Dornberger et al., "The Dependence of Ring Like Distributed Stacking Faults on the Axial Temperature Gradient of Growing Czochralski Silicon Crystals", Electrochemical Society Proceedings, vol. 95–4, pp. 294–305 (1995).

Dornberger, E., et al., "Simulation of Grown–In Voids in Czochralski Silicon Crystals", Electrochemical Society Proceedings, vol. 97, No. 22, pp. 40–49.

Dornberger, E., et al., "The Impact of Dwell Time Above 900° C. During Crystal Growth on the Gate Oxide Integrity of Silicon Wafers", Electrochemical Society Proceedings, vol. 96, No. 13, pp. 140–151.

Dornberger, E., et al., "Simulation of Non–Uniform Grown–In Void Distributions in Czochralski Silicon Crystals", Electrochemical Society Proceedings, vol. 98, vol. 1, pp. 490–503.

Eidenzon, A.M., et al., "Influence of growth rate on swirl defects in large dislocation–free crystals of silicon grown by the Czochralski method" Soviet Physics Crystallography, vol. 30(5), (1985), pp. 576–580.

Eidenzon, A.M., et al., "Defect–Free Silicon Crystals Grown by the Czochralski Technique" Inorganic Materials, vol. 33–3 (1997) pp. 219–225.

Foll, H., et al. "The Formation of Swirl Defects in Silicon by Agglomeration of Self–Interstitials", Journal of Crystal Growth, 1977, pp. 90–1087, vol. 40, North–Holland Publishing Company.

Hara, et al., "Enhancement of Oxygen Precipitation in Quenched Czochralski Silicon Crystals", J. Appl. Phys., vol. 66, No. 8, pp. 3958–3960 (1989).

Hourai, M., et al., "Improvement of Gate Oxide Integrity Characteristics of CZ–Grown Silicon Crystals", Progress in Semiconductor Fabrication presented by: Semiconductor Equipment and Materials International, Semicon/Europa 93, Mar. 30–Apr. 1, 1993, Geneva, Switzerland.

Hourai, M., et al. "Growth Parameters Determining the Type of Grown–In Defects in Czockralski Silicon Crystals", Materials Science Forum, vols. 196–201 (1995) pp. 1713–1718.

International Search Report for Application No. PCT/US 99/24068 dated Oct. 13, 1999, 7 pages.

Izunome K., et al., "Light Point Defects on Hydrogen Annealed Silicon Wafer, Jpn. J. Appl. Phys. vol. 36, pp. L1127–L1129, 1997.

Jacob, et al., "Determination of Vacancy Concentrations in the Bulk of Silicon Wafers by Platinum Diffusion Experiments", J. Appl. Phys., vol. 82, No. 1, pp. 182–191 (1997).

Kissinger, et al., "A Method for Studying the Grown–In Defect Density Spectra in Czochralski Silicon Wafers", J. Electrochem. Soc., vol. 144, No. 4, pp. 1447–1456 (1997).

Lemke, H., et al., "Analytical Approximations for the Distributions of Intrinsic Point Defects in Grown Silicon Crystals", Phys. Stat. Sol. (a) vol. 176 (1999), pp. 843–865.

Miyazaki M., et al., "Microstructure Observation of 'Crystal–Originated Particles' on Silicon Wafers", Jpn. J. Appl. Phys., vol. 34, pp. 6303–6307, 1995.

Nakamura, Kozo, et al., "Formation Process of Grown–In Defects in Czochralski Grown Silicon Crystals", Journal of Crystal Growth, vol. 180, pp. 61–72, 1997.

Park, J.G., et al., "Nature of D–Defect in CZ Silicon: D–Defect Dissolution and D–Defect Related T.D.D.B.", Material Science Forum, vol.s. 196–201, 1995, pp. 1697–1706.

Park, J.G., et al., "Effect of Crystal Defects on Device Characteristics", *Proceedings of the Symposium on* Crystalline Defects and Contamination: Their Impact And Control In Device Manufacturing II, Proceed. vol. 97–22 (1997), pp. 173–195.

Puzanov, N.I., et al., "Influence of Transitional Crystallization Regimes on Microdefects in Silicon", USSR Academy of Sciences Newsletter, vol. 22, No. 8 (1986), pp. 1237–1242.

Puzanov, N.I.,et al., "Relaxation In A System Of Point Defects In A Growing Dislocation–Free Crystal Of Silicon", Sov. Phys. Crystallogr., vol. 31, No. 2, (1986) pp. 219–222.

Puzanov, N.I., et al., "The effect of thermal history during crystal growth on oxygen precipitation in Czochralski–grown silicon", Semicond. Sci. Technol., vol. 7, (1992), pp. 406–413.

Puzanov, N., et al., "Formation of the bands of anomalous oxygen precipitation in Czochralski–grown Si crystals" Journal of Crystal Growth vol. 137, (1994), pp. 642–652.

Puzanov, N., et al., "The Role of Intrinsic Point Defects in the Formation of Oxygen Precipitation Centers in Dislocation–Free Silicon" Crystallography Reports, vol. 41, No. 1, (1996), pp. 134–141.

Puzanov, N.I., et al., "Cultivation, Morphology and Structural Integrity of Dislocation–Free Silicon Tetracrystals", Inorganic Materials, vol. 32, No. 8 (1996), pp. 903–912.

Puzanov, N.L., et al., "Harmful Microdefects in the Seed–End Portion of Large–Diameter Silicon Ingots", Inorganic Materials, vol. 33, No. 8, (1997) pp. 765–769.

Puzanov, N., et al., "Modelling microdefect distribution in dislocation–free Si crystals grown from the melt", Journal of Crystal Growth, 178, (1997), pp. 468–478.

Puzanov, N., et al., "Role of Vacancies in the Nucleation of Ringlike–patterned Oxidation–induced Stacking Faults in Melt–grown Silicon Crystals" Inorganic Materials, vol. 34–4, (1998) pp. 307–314.

Roksnoer, P.J., "Microdefects in a Non–Striated Distribution in Floating–Zone Silicon Crystals", Journal of Crystal Growth, vol. 53 (1981), pp. 563–573.

Roksnoer, P.J., "The Mechanism of Formation of Microdefects in Silicon", Journal of Crystal Growth, vol. 68 (1984), pp. 596–612.

Shimanuki, Y., et al., "Effects of Thermal History on Microdefect Formation in Czochralski Silicon Crystals", Japanese Journal of Applied Physics, vol. 24, No. 12, (1985), pp. 1594–1599.

Sinno, T., et al., "On the Dynamics of the Oxidation–Induced Stacking–Fault Ring in as–grown Czochralski silicon crystals", Applied Physics Letters, vol. 70, No. 17, pp. 2250–2252, 1997.

Sinno, T., et al., "Point Defect Dynamics and the Oxidation–Induced Stacking–Fault Ring in Czochralski–Grown Silicon Crystals", J. Electrochem. Soc., vol. 145, No. 1, pp. 302–318, 1998.

Takano, K., et al., "Relationship Between Grown–in Defects and Thermal History During CZ Si Crystal Growth", Materials Science Forum, vols. 196–201, 1995, pp. 1707–1712.

Tan, T. Y., "Point Defects, Diffusion Processes, and Swirl Defect Formation in Silicon", Appl. Phys. A., vol. 37, pp. 1–17, 1985.

Vanhellemont, J., et al., "Defects in As–Grown Silicon and Their Evolution During Heat Treatments", Materials Science Forum, vols. 258–263, pp. 341–346, 1997.

von Ammon et al., "The Dependence of Bulk Defects on the Axial Temperature Gradient of Silicon Crystals During Czochralski Growth", Journal of Crystal Growth, vol. 151, pp. 273–277 (1995).

von Ammon et al. "Bulk properties of very large diameter silicon single crystals" Journal of Crystal Growth, vol. 198/199, (1999), pp. 390–398.

Voronkov, V., et al., "Behaviour and Effects of Intrinsic Point Defects in the Growth of Large Silicon Crystals", Electrochemical Society Proceedings, vol. 97–22, pp. 3–17 (1997).

Voronkov, "The Mechanism of Swirl Defects Formation in Silicon," Journal of Crystal Growth, vol. 59, pp. 625–643 (1982).

Wijaranakula, W., "Effect of high–temperature annealing on the dissolution of the D–defects in n–type Czochralski silicon", Appl. Phys. Lett., vol. 68, No. 8, (1994), pp. 1030–1032.

Wijaranakula, W., "Numerical Modeling of the Point Defect Aggregation during the Czochralski Silicon Crystal Growth", Journal of Electrochemical Society, vol. 139, No. 2 (Feb. 1992), pp. 604–616.

Winkler, et al., "Improvement of the Gate Oxide Integrity by Modifying Crystal Pulling and Its Impact on Device Failures", J. Electrochem. Soc., vol. 141, No. 5, pp. 1398–1401 (1994).

Yamagishi, et al., "Recognition of D Defects in Silicon Signle Crystals by Preferential Etching and Effect on Gate Oxide Integrity", Semicond. Sci Technol. 7, 1992, A135–A140.

Yamauchi, et al., "Application of Copper–Decoration Method to Characterize As–Grwon Czochralski–Silicon", Jpn. J. Appl. Phys., vol. 31, 1992, pp. L439–L442.

Zimmerman, H., et al. "Gold and Platinum Diffusion: the Key to the Understanding of Intrinsic Point Defect Behavior in Silicon", Applied Physics A Solids and Surfaces, vol. A55, No. 1 (1992) pp. 121–134.

Zimmerman, H., et al. "Vacancy concentration wafer mapping in silicon" Journal of Crystal Growth, vol. 129, (1993) pp. 582–592.

\* cited by examiner

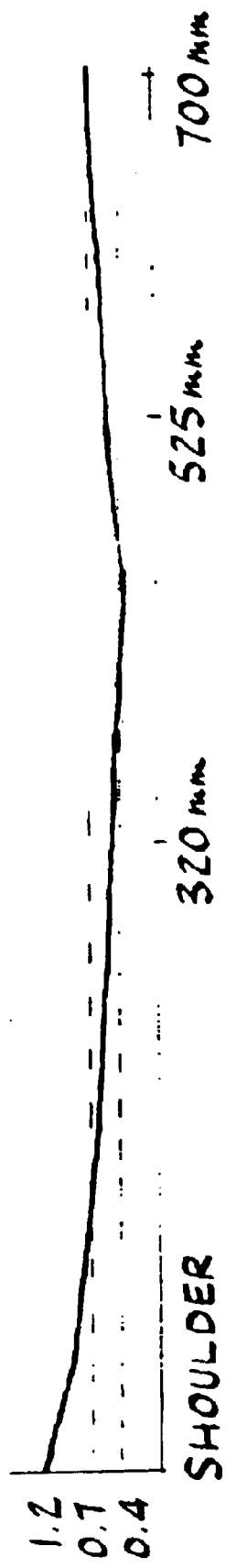
FIG. 14

LPD RADIAL DISTRIBUTION
(BEFORE Ar ANNEALING: 0.09–0.11 um)

THERMAL ANNEALING PROCESS FOR PRODUCING LOW DEFECT DENSITY SINGLE CRYSTAL SILICON

CROSS-REFERENCE TO RELATED APPLICATION

This patent application claims priority from U.S. Provisional Patent Application Serial No. 60/104,304 filed on Oct. 14, 1998, and U.S. Ser. No. 09/416,998, filed on Oct. 13, 1999, now U.S. Pat. No. 6,416,836, issued Jul. 9, 2002.

BACKGROUND OF THE INVENTION

The present invention generally relates to the preparation of semiconductor grade single crystal silicon which is used in the manufacture of electronic components. More particularly, the present invention relates to single crystal silicon ingots and wafers having a first axially symmetric region of silicon self-interstitial dominated material which is substantially free of agglomerated intrinsic point defects and a second axially symmetric region, or core, of vacancy dominated material which is also substantially free of agglomerated vacancy defects, as well as a process for the preparation thereof.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the crystal growth chamber as the crystal cools after solidification. Such defects arise, in part, due to the presence of an excess (i.e., a concentration above the solubility limit) of intrinsic point defects, which are known as vacancies and self-interstitials. Silicon crystals grown from a melt are typically grown with an excess of one or the other type of intrinsic point defect, either crystal lattice vacancies ("V") or silicon self-interstitials ("I"). It has been suggested that the type and initial concentration of these point defects in the silicon are determined at the time of solidification and, if these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex-and highly integrated circuits.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

Defects relating to self-interstitials are less well studied. They are generally regarded as being low densities of interstitial-type dislocation loops or is networks. Such defects are not responsible for gate oxide integrity failures, an important wafer performance criterion, but they are widely recognized to be the cause of other types of device failures usually associated with current leakage problems.

The density of such vacancy and self-interstitial agglomerated defects in Czochralski silicon is conventionally within the range of about $1*10^3/cm^3$ to about $1*10^7/cm^3$. While these values are relatively low, agglomerated intrinsic point defects are of rapidly increasing importance to device manufacturers and, in fact, are now seen as yield-limiting factors in device fabrication processes.

To date, there generally exists three main approaches to dealing with the problem of agglomerated intrinsic point defects. The first approach includes methods which focus on crystal pulling techniques in order to reduce the number density of agglomerated intrinsic point defects in the ingot. This approach can be further subdivided into those methods having crystal pulling conditions which result in the formation of vacancy dominated material, and those methods having crystal pulling conditions which result in the formation of self-interstitial dominated material. For example, it has been suggested that the number density of agglomerated defects can be reduced by (i) controlling $v/G_0$ to grow a crystal in which crystal lattice vacancies are the dominant intrinsic point defect, and (ii) influencing the nucleation rate of the agglomerated defects by altering (generally, by slowing down) the cooling rate of the silicon ingot from about 1100° C. to about 1050° C. during the crystal pulling process. While this approach reduces the number density of agglomerated defects, it does not prevent their formation. As the requirements imposed by device manufacturers become more and more stringent, the presence of these defects will continue to become more of a problem.

Others have suggested reducing the pull rate, during the growth of the body of the crystal, to a value less than about 0.4 mm/minute. This suggestion, however, is also not satisfactory because such a slow pull rate leads to a reduced throughput for each crystal puller. More importantly, such pull rates lead to the formation of single crystal silicon having a high concentration of self-interstitials. This high concentration, in turn, leads to the formation of agglomerated self-interstitial defects and all the resulting problems associated with such defects.

A second approach to dealing with the problem of agglomerated intrinsic point defects includes methods which focus on the dissolution or annihilation of agglomerated intrinsic point defects subsequent to their formation. Generally, this is achieved by using high temperature heat treatments of the silicon in wafer form. For example, Fusegawa et al. propose, in European Patent Application 503,816 A1, growing the silicon ingot at a growth rate in excess of 0.8 mm/minute, and heat treating the wafers which are sliced from the ingot at a temperature in the range of 1150° C. to 1280° C. to reduce the defect density in a thin region near the wafer surface.

Such a process can be problematic, however, as the diameter of the ingot increases; that is, the growth rate may not be sufficient to ensure the material is entirely m dominated by vacancy-type intrinsic point defects. If agglomerated silicon self-interstitial defects are formed, thermal treatments are generally not effective for removing or dissolving them.

A third approach to dealing with the problem of agglomerated intrinsic point defects is the epitaxial deposition of a thin crystalline layer of silicon on the surface of a single crystal silicon wafer. This process provides a single crystal silicon wafer having a surface which is substantially free of agglomerated intrinsic point defects. Epitaxial deposition, however, substantially increases the cost of the wafer.

In view of these developments, a need continues to exist for a method of single crystal silicon preparation which acts to prevent the formation of agglomerated self-interstitial intrinsic point defects by suppressing the agglomeration reactions which produce them, while affording the means by which to subsequently remove agglomerated vacancy defects present. Such a method would also afford single crystal silicon wafers having epi-like yield potential, in terms of the number of integrated circuits obtained per wafer, without having the high costs associated with an epitaxial process.

SUMMARY OF THE INVENTION

Among the objects of the present invention, therefore, is the provision of single crystal silicon ingot, or wafer derived therefrom, having an axially symmetric region of substantial radial width which is substantially free of defects resulting from an agglomeration of crystal lattice vacancies or silicon self-interstitials; the provision of such a wafer wherein a substantially defect free axially symmetric region of interstitial dominated material surrounds a core of vacancy dominated material; the provision of such a wafer wherein the core of vacancy material has a nonuniform distribution of agglomerated vacancy defects; the provision of a process for preparing a single crystal silicon ingot, or wafer derived therefrom, wherein concentration of self-interstitials is controlled in order to prevent an agglomeration of such defects in an axially symmetric segment of a constant diameter portion of the ingot, as the ingot cools from the solidification temperature; and, the provision of such a process wherein agglomerated vacancy defects, if present, are dissolved by thermal treatment of the silicon in wafer form.

Briefly, therefore, the present invention is directed to a single crystal silicon wafer having a central axis, a front side and a back side which are generally perpendicular to the central axis, a central plane between the front and back sides, a circumferential edge, and a radius extending from the central axis to the circumferential edge. The wafer comprises a first axially symmetric,region, extending radially inwardly from the circumferential edge, in which silicon self-interstitials are the predominant intrinsic point defect and which is substantially free of agglomerated interstitial defects, and a second axially symmetric region in which vacancies are the predominant intrinsic point defect, the second axially symmetric region comprising a surface layer extending from the front side toward the central plane and a bulk layer extending from the surface layer to the central plane, the concentration of agglomerated vacancy defects present in the surface layer being less than the concentration in the bulk layer.

The present invention is further directed to a process for preparing a single crystal silicon wafer which is substantially free of agglomerated intrinsic point defects. The process comprising thermally annealing a single crystal silicon wafer at a temperature in excess of about 1000° C. in an atmosphere of hydrogen, argon or a mixture thereof, said wafer having a central axis, a front side and a back side which are generally perpendicular to the central axis, a central plane between the front and back sides, a circumferential edge, a radius extending from the central axis to the circumferential edge, a first axially symmetric region extending radially inward from the circumferential edge in which silicon self-interstitials are the predominant intrinsic point defect and which is substantially free of agglomerated interstitial defects, and a second axially symmetric region, located radially inward of the first axially symmetric region, in which vacancies are the predominant intrinsic point defect. The thermal anneal acts to dissolve agglomerated vacancy defects present in the second axially symmetric region within a layer extending from the front side toward the central plane.

The present invention is still further direction to a process for preparing a silicon wafer which is substantially free of agglomerated intrinsic point defects, the wafer being sliced from a single crystal silicon ingot having a central axis, a seed-cone, an end-cone, and a constant diameter portion which extends between the seed-cone and the end-cone, the constant diameter portion having a circumferential edge and a radius extending from the circumferential edge toward the central axis, the ingot being grown from a silicon melt and then cooled from the solidification temperature in accordance with the Czochralski method The process comprises (i) growing the single crystal silicon ingot, wherein the growth velocity, v, and an average axial temperature gradient, $G_0$, are controlled during the growth of the constant diameter portion of the ingot over a temperature range from solidification to a temperature of no less than about 1325° C. to cause the formation of a segment of the constant diameter portion which, upon cooling of the ingot from the solidification temperature, comprises a first axially symmetrical region extending radially inward from the circumferential edge toward the central axis in which silicon self-interstitials are the predominant intrinsic point defect and which is substantially free of agglomerated interstitial defects, and a second axially symmetric region in which vacancies are the predominant intrinsic point defect; (ii) slicing the segment of the constant diameter portion to obtain a wafer, the wafer having a front side and a back side which are generally perpendicular to the central axis, and a central plane between the front and back sides, the wafer comprising the first and second axially symmetric regions; and, (iii) thermally annealing the wafer at a temperature in excess of about 1000° C. in an atmosphere of hydrogen, argon, oxygen, nitrogen, or a mixture thereof to dissolve agglomerated vacancy defects present in the second axially symmetric region within a layer extending from the front surface toward the central plane of the wafer.

Other objects and features of this invention will be in part apparent and in part pointed out hereinafter.

BRIEF DESCRIPTION OF THE DRAWINGS

FIG. 14 is an image produced by a scan of the minority carrier lifetime of an axial cut of an entire ingot following a series of oxygen precipitation heat treatments, as described in Example 4.

DETAILED DESCRIPTION OF THE PREFERRED EMBODIMENTS

Based upon experimental evidence to date, it appears that the type and initial concentration of intrinsic point defects, such as silicon lattice vacancies or silicon self-interstitials, in single crystal silicon wafers are initially determined as the ingot, from which these wafers are obtained, cools from the temperature of solidification (i.e., about 1410° C.) to a temperature greater than 1300° C. (i.e., at least about 1325 C., at least about 1350° C. or even at least about 1375° C.); that is, the type and initial concentration of these defects are controlled by the ratio $v/G_0$, where v is the growth velocity and $G_0$ is the average axial temperature gradient over this temperature range.

Figure 1:
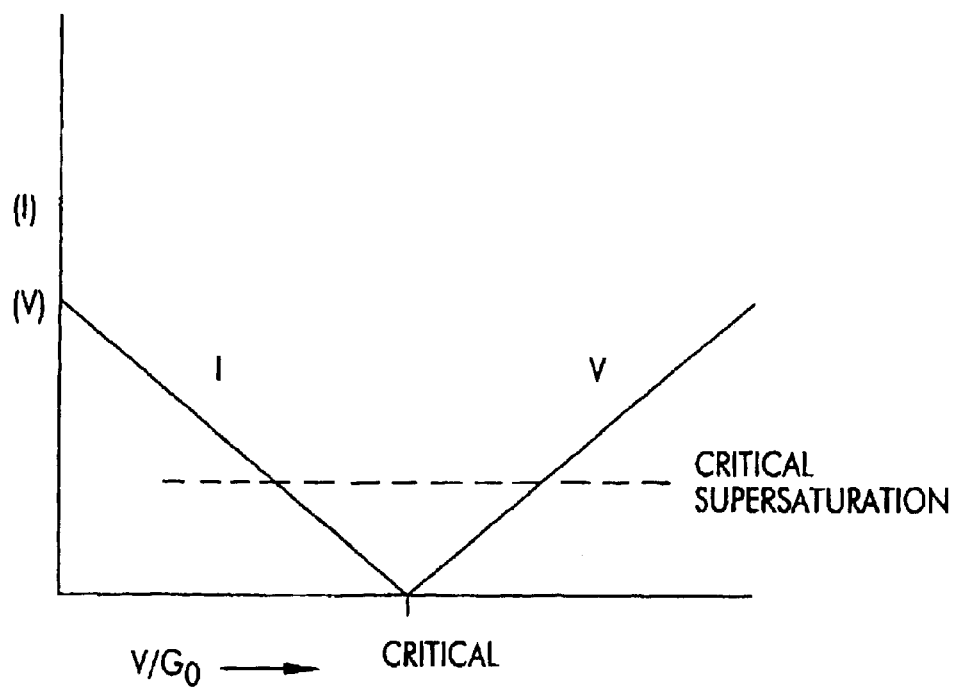
FIG. 1 is a graph which shows an example of how the w initial concentration of self-interstitials, [I], and vacancies, [V], changes with an increase in the value of the ratio $v/G_0$, where v is the growth rate and $G_0$ is the average axial temperature gradient.
Figure 2:
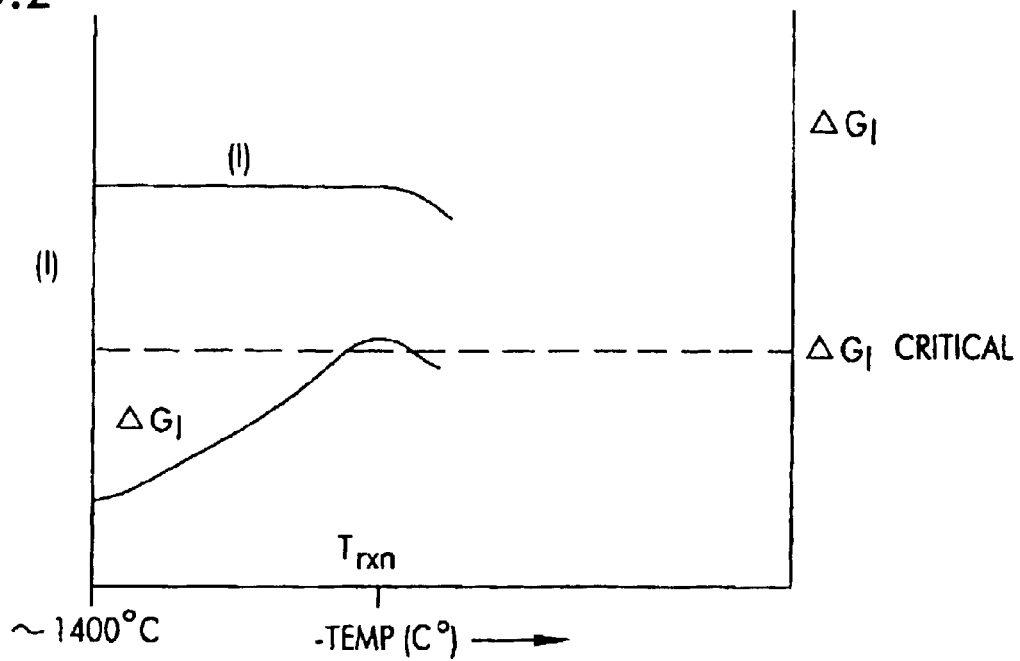
FIG. 2 is a graph which shows an example of how $\Delta G_1$, the change in free energy required for the formation of agglomerated interstitial defects, increases as the temperature, T, decreases, for a given initial concentration of self-interstitials, [I].

Referring now to FIG. 1, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. At this critical value, the concentrations of these intrinsic point defects are at equilibrium. However, as the value of $v/G_0$ exceeds the critical value, the concentration of vacancies increases. Likewise, as the value of $v/G_0$ falls below the critical value, the concentration of self-interstitials increases. If these concentrations reach a level of critical supersaturation in the system, and if the mobility of the point defects is sufficiently high, a reaction, or an agglomeration event, will likely occur.

Accordingly, as reported elsewhere (see, e.g., PCT/US98/07365 and PCT/US98/07304), it has been discovered that the reactions in which vacancies within the silicon matrix react to produce agglomerated vacancy defects and in which self-interstitials within the silicon matrix react to produce agglomerated interstitial defects can be suppressed. Without being bound to a particular theory, it is generally believed that these reactions can be suppressed if the concentration of vacancies and self-interstitials is controlled during the growth and cooling of the crystal ingot, such that the change in free energy ($\Delta G$) of the system never exceeds a critical value at which these agglomeration reactions spontaneously occur. In other words, it is believed that the agglomeration of vacancies and interstitials can be avoided as the ingot cools from the temperature of solidification by preventing the system from becoming critically supersaturated in vacancies or interstitials.

Preventing the formation of such defects can be achieved by establishing an initial concentration of vacancies or interstitials (controlled by $v/G_0(r)$, where $v/G_0$ (r) represents $v/G_0$ as a function of radial position, as further discussed below) which is sufficiently low such that critical supersaturation is never achieved. In practice, however, such concentrations are difficult to achieve across an entire crystal radius and, in general therefore, critical supersaturation may be avoided by suppressing the initial vacancy concentration or the initial interstitial concentration subsequent to crystal solidification (i.e., subsequent to establishing the initial concentration as determined by $v/G_0$ (r)).

Due to the relatively large mobility of self-interstitials (which is generally about $10_{-4}$ cm$^2$/second), and to a lesser extent the mobility of vacancies, it is possible to affect the suppression of interstitials and vacancies over relatively large distances .(i.e., distances of about 5 cm to about 10 cm or more) by the m radial diffusion of self-interstitials to sinks located at the crystal surface or to vacancy dominated regions located within the crystal. Radial diffusion can be effectively used to suppress the concentration of self-interstitials and vacancies, provided sufficient time is allowed for the radial diffusion of the initial concentration of intrinsic point defects. In general, the diffusion time will depend upon the radial variation in the initial concentration of self-interstitials and vacancies, with lesser radial variations requiring shorter diffusion times.

Figure 3:
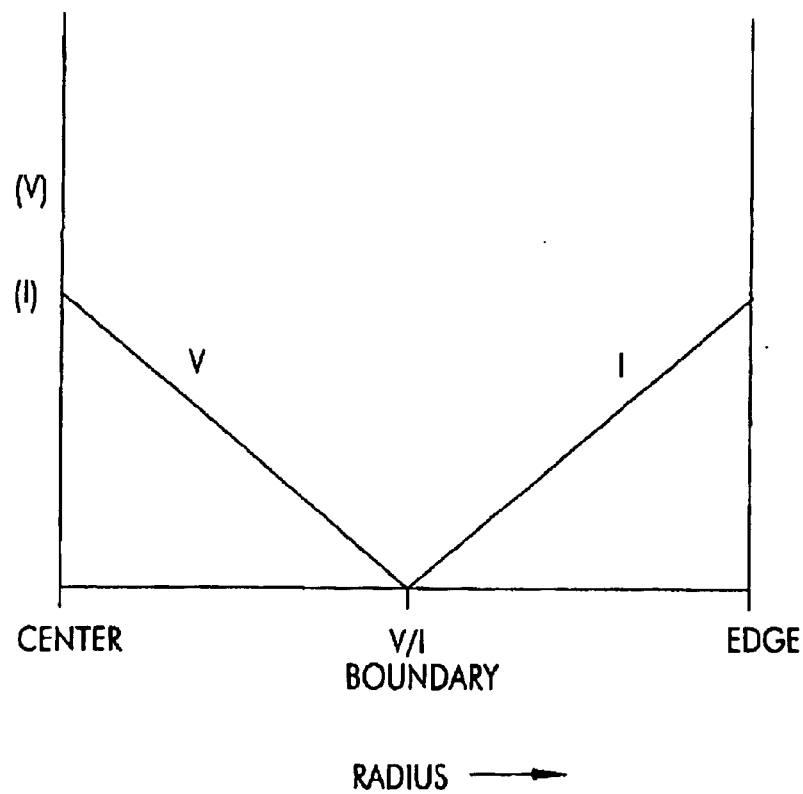
FIG. 3 is a graph which shows an example of how the initial concentration of self-interstitials, [I], and vacancies, [V], can change along the radius of an ingot or wafer, as the value of the ratio v/G₀ decreases, due to an increase in the value of G₀. Note that at the V/I boundary a transition occurs from vacancy dominated material to self-interstitial dominated material.
Figure 4:
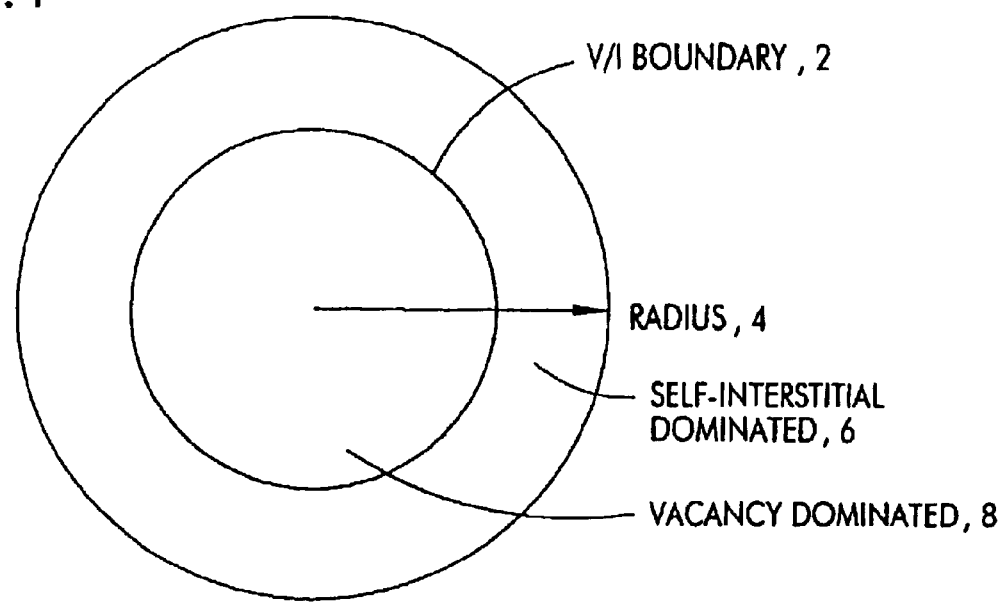
FIG. 4 is a top plan view of a single crystal silicon ingot or wafer showing regions of vacancy, V, and self-interstitial, I, dominated materials respectively, as well as the V/I boundary that exists between them.

Typically, the average axial temperature gradient, $G_0$, increases as a function of increasing radius for single crystal silicon which is grown according to the Czochralski method. This means that the value of $v/G_0$ is typically not singular across the radius of an ingot. As a result of this variation, the type and initial concentration of intrinsic point defects are not constant. If the critical value of $v/G_0$, denoted in FIGS. 3 and 4 as the V/I boundary 2, is reached at some point along the radius 4 of the ingot, the material will switch from being vacancy dominated to self-interstitial dominated. In addition, the ingot will contain an axially symmetric region of self-interstitial dominated material 6 (in which the initial concentration of silicon self-interstitial atoms increases as a function of increasing radius), surrounding a generally cylindrical region of vacancy dominated material 8 (in which the initial concentration of vacancies decreases as a function of increasing radius).

As an ingot containing a V/I boundary is cooled from the temperature of solidification, radial diffusion of interstitial atoms and vacancies causes a radially inward shift in the V/I boundary due to a recombination of self-interstitials with vacancies. In addition, radial diffusion of self-interstitials to the surface of the crystal will occur as the crystal cools. The surface of the crystal is capable of maintaining near equilibrium point defect concentrations as the crystal cools. Radial diffusion of point defects will tend to reduce the self-interstitial concentration outside the V/I boundary and the vacancy concentration inside the V/I boundary. If enough time is allowed for diffusion, therefore, the concentration of vacancy and interstitials everywhere may be such that $\Delta G_V$ and $\Delta G_I$ will be less than the critical values at which the vacancy agglomeration reaction and the interstitial agglomeration reactions occur.

Figure 5:
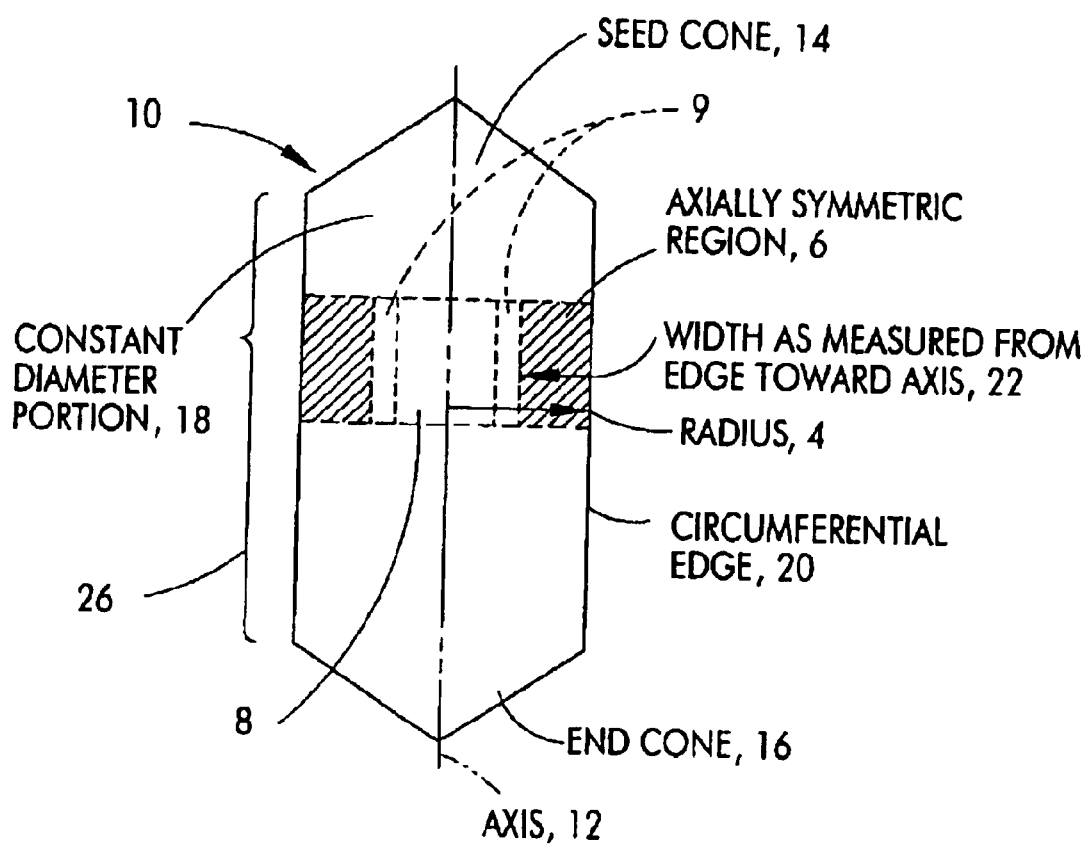
FIG. 5 is a longitudinal, cross-sectional view of a single crystal silicon ingot showing, in detail, an axially symmetric region of a constant diameter portion of the ingot.
Figure 6:
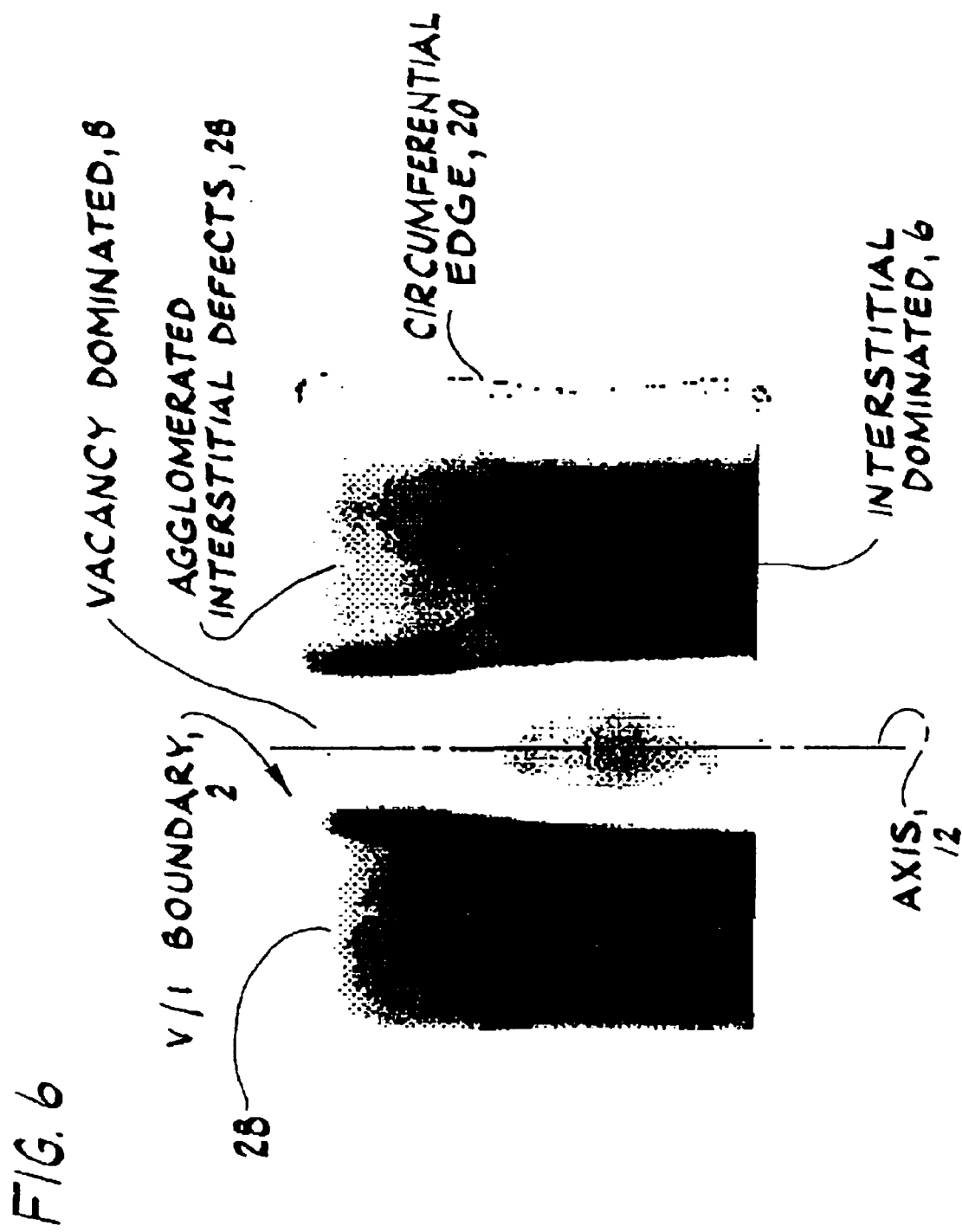
FIG. 6 is an image produced by a scan of the minority carrier lifetime of an axial cut of the ingot following a series of oxygen precipitation heat treatments, showing in detail a generally cylindrical region of vacancy dominated material, a generally annular shaped axially symmetric region of self-interstitial dominated material, the V/I boundary present between them, and a region of agglomerated interstitial defects.

Referring now to FIG. 5, the crystal growth conditions (including growth velocity, v, average axial temperature gradient, $G_0$, and the cooling rate) are preferably controlled to cause the formation of a single crystal silicon ingot 10, grown in accordance with the Czochralski method, comprising a central axis 12, a seed-cone 14, an end-cone 16 and a constant diameter portion 18 between the seed-cone and the end-cone. The constant diameter portion has a circumferential edge 20 and a radius 4 extending from the central axis 12 to the circumferential edge 20. The crystal growth conditions may be controlled to cause the formation of (i) a substantially defect-free axially symmetric region of interstitial dominated material 6 and/or (ii) a generally cylindrical region of vacancy dominated material 8, which may also contains a substantially defect-free axially symmetric region 9. When present, the axially symmetric regions 6 and 9 may have varying widths, as further discussed in detail below.

The growth velocity, v, and the average axial temperature gradient, $G_0$, (as previously defined) are typically controlled such that the ratio $v/G_0$ ranges in value from about 0.5 to about 2.5 times the critical value of $v/G_0$ (i.e., about $1 \times 10^{-5}$ cm$^2$/sK to about $5 \times 10^{-5}$ cm$^2$/sK based upon currently available information for the critical value of $v/G_0$). Preferably, the ratio $v/G_0$ will range in value from about 0.6 to about 1.5 times the critical value of $v/G_0$ (i.e., about $1.3 \times 10^{-5}$ cm$^2$/sK to about $3 \times 10^{-5}$ cm$^2$/sK based upon currently available information for the critical value of $v/G_0$). Most preferably, the ratio $v/G_0$ will range in value from about 0.75 to about 1.25 times the critical value of $v/G_0$(i.e., about $1.6 \times 10^{10-5}$ cm$^2$/sK to about $2.1 \times 10^{-5}$ cm$^2$/sK based upon currently available information for the critical value of $v/G_0$). In one particularly preferred embodiment, $v/G_0$ within the generally cylindrical region 9 has a value falling between the critical value of $v/G_0$ and 1.1 times the critical value of $v/G_0$, while in another preferred embodiment $v/G_0$ within the generally cylindrical region 6 has a value falling between the about 0.75 times the critical value of $v/G_0$ and the critical value of $v/G_0$.

To maximize the width of the axially symmetric region 6, and/or 9, it is preferred that the ingot be cooled from the solidification temperature to a temperature in excess of about 1050° C. over a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least l; about 30 hours for 200 mm nominal diameter silicon crystals, and (iii) at least about 20 hours, preferably at least about 40 hours, more preferably at least about 60 hours, and most preferably at least about 75 hours for silicon crystals having a nominal diameter greater than 200 mm. Control of the cooling rate can be achieved by using any means currently known in the art for minimizing heat transfer, including the use of insulators, heaters, radiation shields, and magnetic fields.

Control of the average axial temperature gradient, $G_0$, may be achieved through the design of the "hot zone" of the crystal puller (i.e., the graphite, or other materials, that makes up the heater, insulation, heat and radiation shields, among other things). Although the design particulars may vary depending upon the make and model of the crystal puller, in general, $G_0$ may be controlled using any of the means currently known in the art for controlling heat transfer at the melt/solid interface, including reflectors, radiation shields, purge tubes, light pipes, and heaters. In general, radial variations in $G_0$ are minimized by positioning such an apparatus within about one crystal diameter above the melt/solid interface. $G_0$ can be controlled further by adjusting the position of the apparatus relative to the melt and crystal. This is accomplished either by adjusting the position of the apparatus in the hot zone, or by adjusting the position of the melt surface in the hot zone. In addition, when a heater is employed, $G_0$ may be further controlled by adjusting the power supplied to the heater. Any, or all, of these methods can be used during a batch Czochralski process in which melt volume is depleted during the process.

It is generally preferred for some embodiments of the process for preparing a substantially defect-free substrate wafer that the average axial temperature gradient, $G_0$, be relatively constant as a function of the diameter of the ingot. However, it should be noted that as improvements in hot zone design allow for variations in $G_0$ to be minimized, mechanical issues associated with maintaining a constant growth rate become an increasingly important factor. This is because the growth process becomes much more sensitive to any variation in the pull rate, which in turn directly affects the growth rate, v. In terms of process control, this means that it is favorable to have values for $G_0$ which differ over the radius of the ingot. Significant differences in the value of $G_0$, however, can result in a large concentration of self-interstitials generally increasing toward the wafer edge and, thereby, increase the difficultly in avoiding the formation of agglomerated intrinsic point defects.

In view of the foregoing, the control of $G_0$ involves a balance between minimizing radial variations in $G_0$ and maintaining favorable process control conditions. Typically, therefore, the pull rate after about one diameter of the crystal length will range from about 0.2 mm/minute to about 0.8 mm/minute. Preferably, the pull rate will range from about 0.25 mm/minute to about 0.6 mm/minute and, more preferably, from about 0.3 mm/minute to about 0.5 mm/minute. It is to be noted that the pull rate is dependent upon both the crystal diameter and crystal puller design. The stated ranges are typical for 200 mm diameter crystals. In general, the pull rate will decrease as the crystal diameter increases. However, the crystal puller may be designed to allow pull rates in excess of those stated here. As a result, most preferably the crystal puller will be designed to enable the pull rate to be as fast as possible while still allowing for the formation of an axially symmetric region in accordance with the present invention.

The amount of self-interstitial diffusion is controlled by controlling the cooling rate as the ingot is cooled from the solidification temperature (about 1410° C.) to the temperature at which silicon self-interstitials become immobile, for commercially practical purposes. Silicon self-interstitials appear to be extremely mobile at temperatures near the solidification temperature of silicon, i.e., about 1410° C. This mobility, however, decreases as the temperature of the single crystal silicon ingot decreases. Generally, the diffusion rate of self-interstitials slows such a considerable degree that they are essentially immobile for commercially practical time periods at temperatures less than about 700° C., and perhaps at temperatures as great as 800° C., 900° C., 1000° C., or even 1050° C.

It is to be noted in this regard that, although the temperature at which a self-interstitial agglomeration reaction occurs may in theory vary over a wide range of temperatures, as a practical matter this range appears to be relatively narrow for conventional, Czochralski-grown silicon. This is a consequence of the relatively narrow range of initial self-interstitial concentrations which are typically obtained in silicon grown according to the Czochralski method. In general, therefore, a self interstitial agglomeration reaction may occur, if at all, at temperatures within the range of about 1100° C. to about 800° C., and typically at a temperature of about 1050° C.

Accordingly, within the range of temperatures at which self-interstitials appear to be mobile, and depending upon the temperature in the hot zone,g the cooling rate will typically range from about 0.1° C./minute to about 3° C./minute. Preferably, the cooling rate will range from about 0.1° C./minute to about 1.5° C./minute, more preferably from about 0.1° C./minute to about 1° C./minute, and still more preferably from about 0.1° C./minute to about 0.5° C./minute.

By controlling the cooling rate of the ingot within a range of temperatures in which self-interstitials appear to be mobile, the self-interstitials may be given more time to diffuse to sinks located at the crystal surface, or to vacancy dominated regions, where they may be annihilated. The concentration of such interstitials may therefore be suppressed, which act to prevent an agglomeration event from occurring. Utilizing the diffusivity of interstitials, by controlling the cooling rate, acts to relax the otherwise stringent $v/G_0$ requirements that may be required, in order to obtain an axially symmetric region substantially free of agglomerated defects. Stated another way, as a result of the fact that the cooling rate may be controlled in order to allow interstitials more time to diffuse, a larger range of $v/G_0$ values, relative to the critical value, are acceptable for purposes of obtaining an axially symmetric region free of agglomerated defects.

To achieve such cooling rates over appreciable lengths of the constant diameter portion of the crystal, consideration must also be given to the growth process of the end-cone of the ingot, as well as the treatment of the ingot once end-cone growth is complete. Typically, upon completion of the growth of the constant diameter portion of the ingot, the pull rate will be increased in order to begin the tapering necessary to form the end-cone. However, such an increase in pull rate will result in the lower segment of the constant diameter portion cooling more quickly within the temperature range in which interstitials are sufficiently mobile, as discussed above. As a result, these interstitials may not have sufficient time to diffuse to sinks to be annihilated; that is, the concentration in this lower segment may not be suppressed to a sufficient degree and agglomeration of interstitial defects may result.

In order to prevent the formation of such defects from occurring in this lower segment of the ingot, it is therefore preferred that the constant diameter portion of the ingot have a uniform thermal history in accordance with the Czochralski method. A uniform thermal history may be achieved by pulling the ingot from the silicon melt at a relatively constant rate during the growth of not only the constant diameter portion, but also during the growth of the end-cone of the crystal and possibly subsequent to growth of the end-cone. More specifically, it is preferred that when the growth of the end-cone is initiated a pull rate for the end-cone is established which ensures any segment of the constant diameter portion of the ingot remaining at a temperature in excess of about 1050° C. will experience the same thermal history as other segments of the constant diameter portion of the ingot which contain an axially symmetric region free of agglomerated intrinsic point defects which have already been cooled to a temperature of less than about 1050° C. A relatively constant rate may be achieved, for example, by (i) reducing the rates of rotation of the crucible and crystal during the growth of the end-cone relative to the crucible and crystal rotation rates during the growth of the constant diameter portion of the crystal, and/or (ii) increasing the power supplied to the heater used to heat the silicon melt during the growth of the end-cone relative to the power conventionally supplied during end-cone growth. These additional adjustments of the process variables may occur either individually or in combination.

As previously noted, a minimum radius of the vacancy dominated region exists for which the suppression of agglomerated interstitial defects may be achieved. The value of the minimum radius depends on $v/G_0$ (r) and the cooling rate. As crystal puller and hot zone designs will vary, the ranges presented above for $v/G_0$ (r), pull rate, and cooling rate will also vary. Likewise these conditions may vary along the length of a growing crystal. Also, as noted above, the width of the interstitial dominated region free of agglomerated interstitial defects is preferably maximized. Thus, it is desirable to maintain the width of this region to a value which is as close as possible to, without exceeding, the difference between the crystal radius and the minimum radius of the vacancy dominated region along the length of the growing crystal in a given crystal puller.

The crystal pull rate profile needed in order to maximize the width of axially symmetric region 6, and optionally 9, for a given crystal puller hot zone design may be determined empirically. Generally speaking, this empirical approach involves first obtaining readily available data on the axial temperature profile for an ingot grown in a particular crystal puller, as well as the radial variations in the average axial temperature gradient for an ingot grown in the same puller. Collectively, this data is used to pull one or more single crystal silicon ingots, which are then analyzed for the presence of agglomerated interstitial defects. In this way, an optimum pull rate profile can be determined.

In addition to the radial variations in $v/G_0$ resulting from an increase in $G_0$ over the radius of the ingot, $v/G_0$ may also vary axially as a result of a change in v, or as a result of natural variations in $G_0$ due to the Czochralski process. For a standard Czochralski process, v is altered as the pull rate is adjusted throughout the growth cycle, in order to maintain the ingot at a constant diameter. These adjustments, or changes, in the pull rate in turn cause $v/G_0$ to vary over the length of the constant diameter portion of the ingot. Accordingly, it is therefore desirable to control the pull rate in order to maximize the width of the axially symmetric region 6, and/or 9, in the ingot. As a result, however, variations in the radius of the ingot may occur. In order to ensure that the resulting ingot has a constant diameter, the ingot is therefore preferably grown to a diameter larger than that which is desired. The ingot is then subjected to processes standard in the art to remove excess material from the surface, thus ensuring that an ingot having a constant diameter portion is obtained.

Referring again to FIG. 5, substrate wafers of the present invention are sliced from a single crystal silicon ingot 10 which comprises a substantially defect-free region of interstitial dominated material 6, which may additionally surround a generally cylindrical region 8 of vacancy dominated material (a portion or all of which may be substantially defect-free as well). Alternatively, region 6 may extend from center to edge, or region 9 may extend from center to edge; that is, the width of substantially defect-free region 6 or region 9 may be about equal to the width of the ingot.

Axially symmetric region 6 generally has a width, as measured from circumferential edge 20 radially inward toward central axis 12, which in some embodiments is at least about 5%, 10%, 20% and even about 30% of the radius of the constant diameter portion of the ingot, while in other embodiments it is at least about 40%, at least about 60%, or preferably even at least about 80% of the radius. Additionally, when present, the axially symmetric region 9 generally has a width, as measured along the radius extending from V/I boundary 2 to axis 12, which is at least about 15 mm in width, preferably at least about 7.5%, more preferably at least about 15%, still more preferably at least about 25%, and most preferably at least about 50% of the radius of the constant diameter portion of the ingot. In a particularly preferred embodiment, axially symmetric region 9 includes axis 12 of the ingot, i.e., the axially symmetric region 9 and generally cylindrical region 8 coincide.

Axially symmetric regions 6 and 9 typically extend over a length of at least about 20% of the length of the constant diameter portion of the ingot. Preferably, however, these regions have lengths of at least about 40%, more preferably at least about 60%, and still more preferably at least about 80% of the length of the constant diameter portion of the ingot.

It is to be noted that the width of axially symmetric regions 6 and 9 may have some variation along the length of the central axis 12. For an axially symmetric region 6 of a given length, therefore, the width is determined by measuring the distance from the circumferential edge 20 of the ingot 10 radially toward a point which is farthest from the central axis. Similarly, the width of axially symmetric region 9 is determined by measuring the distance from the V/I boundary 2 radially toward a point which is farthest from the central axis. In other words, the width for each region is measured such that the minimum distance within the given length of the axially symmetric region 6 or 9 is determined.

For an ingot having a V/I boundary, i.e., an ingot containing material which is vacancy dominated, low oxygen content material, i.e., less than about 13 PPMA (parts per million atomic, ASTM standard F-121-83), is typically preferred. More preferably, the single crystal silicon contains less than about 12 PPMA oxygen, still more preferably less than about 11 PPMA oxygen, and most preferably less than about 10 PPMA oxygen. A low oxygen content is preferred because, in medium to high oxygen contents wafers (i.e., 14 PPMA to 18 PPMA), the formation of oxygen-induced stacking faults and bands of enhanced oxygen clustering just inside the V/I boundary becomes more pronounced. Each of these is a potential source for problems in a given integrated circuit fabrication process.

The effects of enhanced oxygen clustering may be further reduced by a number of methods, used singularly or in combination. For example, oxygen precipitate nucleation centers typically form in silicon which is annealed at a temperature in the range of about 350° C. to about 750° C. For some applications, therefore, it may be preferred that the crystal be a "short" crystal, that is, a crystal which has been grown in a Czochralski process until the seed end has cooled from the melting point of silicon (about 1410° C.) to about 750° C. after which the ingot is rapidly cooled. In this way, the time spent in the temperature range critical for nucleation center formation is kept to a minimum and the oxygen precipitate nucleation centers have inadequate time to form in the crystal puller Preferably, however, oxygen precipitate nucleation centers formed during the growth of the single crystal are dissolved by annealing single crystal silicon wafers which have been sliced from the ingot prepared in accordance with the present process. Slicing, a swell as standard silicon lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, N.Y., 1982 (incorporated herein by reference). Provided they have not been subjected to a stabilizing heat-treatment, oxygen precipitate nucleation centers can be annealed out of silicon wafers by rapidly In heating the silicon to a temperature of at least about 875° C., and preferably continuing to increase the temperature to at least 1000° C., at least 1100° C., or more. By the time the silicon reaches 1000° C., substantially all (e.g., >99%) of such defects have annealed out. It is important that the wafers be rapidly heated to these temperatures, i.e., that the rate of temperature increase be at least about 10° C. per minute and more preferably at least about 50° C. per minute. Otherwise, some or all of the oxygen precipitate nucleation centers may be stabilized by the heat-treatment. Equilibrium appears to be reached in relatively short periods of time, i.e., on the order of about 60 seconds or less. Accordingly, oxygen precipitate nucleation centers in the single crystal silicon may be dissolved by annealing it at a temperature of at least about 875° C., preferably at least about 950° C., and more preferably at least about 1100° C., for a period of at least about 5 seconds, and preferably at least about 10 minutes.

The dissolution may be carried out in a conventional furnace or in a rapid thermal annealing (RTA) system. The rapid thermal anneal of silicon may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds one such commercially available RTA furnace is the model 610 furnace available from AG Associates (Mountain View, Calif.). In addition, the dissolution may be carried out on silicon ingots or on silicon wafers, preferably wafers.

In one embodiment of the process of the present invention, the initial concentration of silicon self-interstitial atoms is controlled in the axially symmetric, self-interstitial dominated region 6 of ingot 10. Referring again to FIG. 1, in general, the initial concentration of silicon self-interstitial atoms is controlled by controlling the crystal growth velocity, v, and the average axial temperature gradient, $G_0$, such that the value of the ratio $v/G_0$ is relatively near the critical value of this ratio, at which the V/I boundary occurs. In addition, the average axial temperature gradient, $G_0$, can be established such that the variation of $G_0$ as a function of the ingot radius, (i.e., $G_0(r)$, and thus, $v/G_0(r)$), is also controlled.

In another embodiment of the present invention, $V/G_0$ is controlled such that no V/I boundary exists along the radius for at least a portion of the length of the ingot. In this length, the silicon is vacancy dominated from center to circumferential edge and agglomerated vacancy defects are avoided in an axially symmetric region extending radially inward from the circumferential edge of the ingot principally by controlling $V/G_0$. That is, the growth conditions are controlled so that $v/G_0$ has a value falling between the critical value of $v/G_0$ and 1.1times the critical value of $v/G_0$.

It is to be noted that wafers prepared in accordance with the present invention are suitable for use as substrates upon which an epitaxial layer may be deposited. Epitaxial deposition may be performed by means common in the art.

Furthermore, as illustrated by Example. 8, below, it is also to be noted that wafers prepared in accordance with the present invention are particularly well suited for use in combination with thermal annealing treatments in highly pure atmospheres of hydrogen, argon, oxygen or nitrogen, as well mixtures thereof. More specifically, if a vacancy dominated region is present within the wafer and this region contains agglomerated vacancy defects, the wafer may be subjected to a thermal anneal; the temperature, duration and atmosphere of the anneal are such that the agglomerated vacancy defects are effectively annihilated, dissolved or reduced in size within a surface layer of the wafer. Generally, the conditions for this thermal anneal are those commonly used in the art for dissolving such defects. (See, e.g., Fusegawa et al., European Patent Application 503,816 A1; S. Nadahara et al., "Hydrogen Annealed Silicon Wafer," *Solid State Phenomena*, vols. 57–58, pp. 19–26 (1997); and, D. Graf et al., "High-Temperature Annealed Silicon Wafers," *Electrochemical Society Proceedings*, vol. 97–22, pp. 18–25 (1997).) Additionally, wafer loading conditions, temperature ramping and push/pull rates are appropriately selected to ensure slip and warpage are prevented.

Prior to the thermal anneal, the wafers are typically subjected to a cleaning process in order to remove any metallic contaminants present on or near the wafer surface and prevent such contaminants from being driven into the bulk of the wafers during the anneal. Additionally, the wafers may be repeatedly cleaned using a RCA-type SC-1 cleaning solution (see, e.g., F. Shimura, *Semiconductor Silicon Crystal Technology*, Academic Press, 1989, pp. 188–191 and Appendix XII, incorporated herein by reference) to remove any surface oxides present which could lead to surface haze problems if not removed.

In accordance with the present process, the wafers will typically be heated at a temperature for a duration sufficient to dissolve agglomerated vacancy defects present in a surface layer extending from the surface to a desired depth, the temperature and duration increasing as the desired depth increases. More specifically, the wafers will be heated in a conventional quartz tube-type furnace at a temperature in excess of about 1000° C. for at least about 1 hour. Preferably, however, the wafers are heated to a temperature ranging from about 1100° C. to about 1300° C. for about 1 hour to about 4 hours and, more preferably, to a temperature ranging from about 1200° C. to about 1250° C. for about 2 to about 3 hours.

It is to be noted that agglomerated vacancy defects may also be dissolved using a RTA system, which would enable shorter process times to be employed. Typically, if such a process is employed, the wafer will be rapidly heated to the target temperature and annealed at this temperature for a relatively short period of time. In general, the wafer is subjected to a temperature in excess of about 1100° C., preferably about 1150° C., and more preferably about 1200° C. The wafer will generally be maintained at this temperature for at least one second, typically at least several seconds (e.g., 2, 6, 10, or more) and, depending upon the desired characteristics of the wafer, for a period which may range up to about 60 seconds (which is near the limit of commercially available rapid thermal annealers).

It is to be further noted that preferably high in purity quartz or silicon carbide furnace components, such as tubes and boats, will be used in order to avoid the introduction of contaminants during the thermal anneal.

In addition to the temperature, duration, atmosphere and ramping conditions (i.e., the rate at which the target anneal temperature is reached) of the thermal anneal, the size of the agglomerated defects to be dissolved is a factor in the efficiency of the anneal at removing such defects. Accordingly, the conditions necessary to achieve the desired result may be determined empirically by varying the treatment temperature, time and atmosphere composition for a number of samples until a layer of the desired depth is achieved. The desired depth of the surface layer, as measured from the surface and toward the center or central plane of the wafer, may range from a few microns (i.e., about 1, 2, 4, 6, 8, 10 microns), to tens of microns (i.e., 20, 40, 80 microns or more), to hundreds of microns (100, 200, 300 microns or more), up to the center of the wafer.

As further discussed in Example 8, below, subjecting a wafer to this defect dissolving treatment results in a significant reduction in the number density of agglomerated vacancy defects present within the surface layer, as compared to the bulk layer (i.e., the layer extending from the surface layer to the center or central plane of the wafer). More specifically, the number density of these defects within this surface layer, as compared to the bulk of the wafer, can be decreased by about 20%, 40%, 60%, 80% or more. Preferably, however, this surface layer will be rendered substantially free of agglomerated vacancy defects.

Additionally, it is to be noted that the size of the agglomerated vacancy defects present within the surface layer can also be significantly reduced. It is to be further noted that the initial size of these defects may affect the results of the present process because smaller agglomerated defects are more easily dissolved or reduced in size by the thermal anneal treatment. Generally speaking, the size of the agglomerated defects decreases as the width of the vacancy dominated region containing such defects decreases. Accordingly, it is preferred for some embodiments that the width of the vacancy region be minimized in order to enable the more efficient dissolution of such agglomerated defects, when present.

The process of the present invention may be particularly preferred as the diameter of the single crystal silicon ingot increases, as compared to conventional fast-pull methods wherein the ingot is grown at a high rate in an attempt to make the material entirely vacancy dominated. Without being held to any particularly theory, it is generally believed that for ingots having relatively large diameters, (e.g., at least about 300 mm or more) it may not be possible to maintain a growth rate which is sufficiently high to ensure the silicon material is entire vacancy dominated. Stated another way, as the diameter of the ingot increases, it is more likely that the constant diameter portion of the ingot will contain a segment having a region of interstitial dominated material. Growth conditions must therefore be appropriately controlled in order to prevent the formation of agglomerated interstitial defects within this region.

Visual Detection of Agglomerated Defects

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection. (See, e.g., H. Yamagishi et al., Semicond. Sci. Technol. 7, A135 (1992).) Although standard for the detection of agglomerated vacancy defects, this process may also be used to detect agglomerated interstitial defects. When this technique is used, such defects appear as large pits on the surface of the sample when present.

Agglomerated defects may also be detected using laser scattering techniques, such as laser scattering tomography, which typically have a lower defect density detection limit that other etching techniques.

Additionally, agglomerated intrinsic point defects may be visually detected by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In general, regions of interstitial and vacancy dominated material free of agglomerated defects can be distinguished from each other and from material containing agglomerated defects by the copper decoration technique described above.

Regions of defect-free interstitial dominated material contain no decorated features revealed by the etching whereas regions of defect-free vacancy dominated material (prior to a high-temperature oxygen nuclei dissolution treatment as described above) contain small etch pits due to copper decoration of the oxygen nuclei.

Definitions

As used herein, the following phrases or terms shall have the given meanings: "agglomerated intrinsic point defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce dislocation loops and networks, and other such self-interstitial related defects; "agglomerated interstitial defects" shall mean agglomerated intrinsic point defects caused by the reaction in which silicon self-interstitial atoms agglomerate; "agglomerated vacancy defects" shall mean agglomerated vacancy point defects caused by the reaction in which crystal lattice vacancies agglomerate; "radius" means the distance measured from a central axis to a circumferential edge of a wafer or ingot; "substantially free of agglomerated intrinsic point defects" shall mean a concentration of agglomerated defects which is less than the detection limit of these defects, which is currently about $10^3$ defects/cm$^3$; "V/I boundary" means the position along the radius of an ingot or wafer at which the material changes from vacancy dominated to self-interstitial dominated; and "vacancy dominated" and "self-interstitial dominated" mean material in which the intrinsic point defects are predominantly vacancies or self-interstitials, respectively.

EXAMPLES

Examples 1 through 7 illustrate the preparation of a single crystal silicon ingot, from which a wafer may be obtained, the wafering being suitable for thermal annealing in accordance with the present invention; that is, these Examples illustrate that a single crystal silicon wafer may be prepared having a substantially defect free axially symmetric region of interstitial dominated material surrounding a core of vacancy dominated material. Example 8 illustrates the effect thermal annealing has on agglomerated vacancy defects, present in the core of such a wafer.

With regard to Examples 1 through 7, it is to be noted that these Examples set forth one set of conditions that, may be used to achieve the desired result. Alternative approaches exist for determining an optimum pull rate profile for a given crystal puller. For example, rather than growing a series of ingots at various pull rates, a single crystal could be grown at pull rates which increase and decrease along the length of the crystal; in this approach, agglomerated self-interstitial defects would be caused to appear and disappear multiple times during growth of a single crystal. Optimal pull rates could then be determined for a number of different crystal positions.

All Examples are presented for illustrative purposes only and should therefore not be interpreted in a limiting sense.

Example 1

Figure 7:
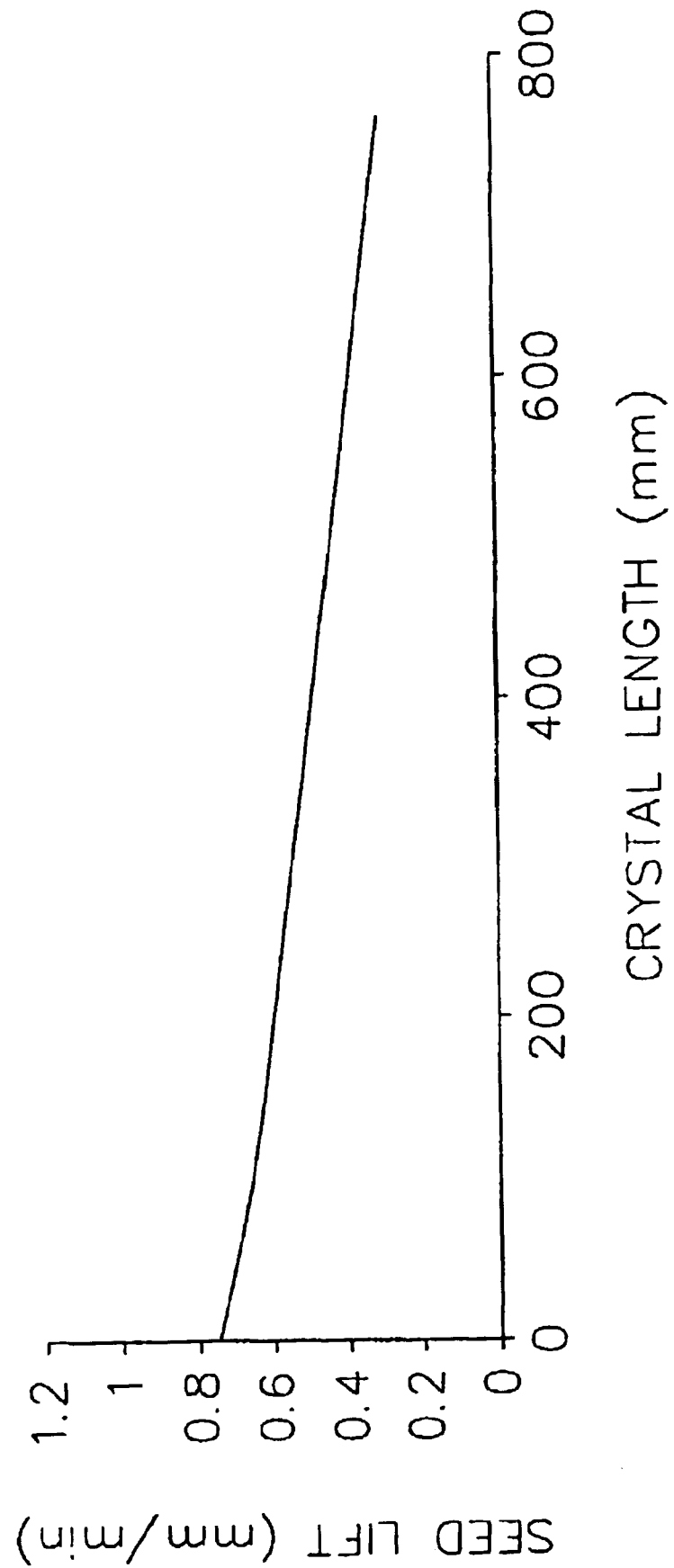
FIG. 7 is a graph of pull rate (i.e., seed lift) as a function of crystal length, showing how the pull rate is decreased linearly over a portion of the length of the crystal.

Optimization Procedure for a Crystal Puller Having a Pre-existing Hot Zone Design A first 200 mm single crystal silicon ingot was grown under conditions in which the pull rate was ramped linearly from about 0.75 mm/min. to about 0.35 mm/min. over the length of the crystal. FIG. 7 shows the pull rate as a function of crystal length. Taking into account the pre-established axial temperature profile of a growing 200 mm ingot in the crystal puller and the pre-established radial variations in the average axial temperature gradient, $G_0$, i.e., the axial temperature gradient at the melt/solid interface, these pull rates were selected to insure that ingot would be vacancy dominated material from the center to the edge at one end of the ingot and interstitial dominated material from the center to the edge of the other end of the ingot. The grown ingot was sliced longitudinally and analyzed to determine where the formation of agglomerated interstitial defects begins.

Figure 8:
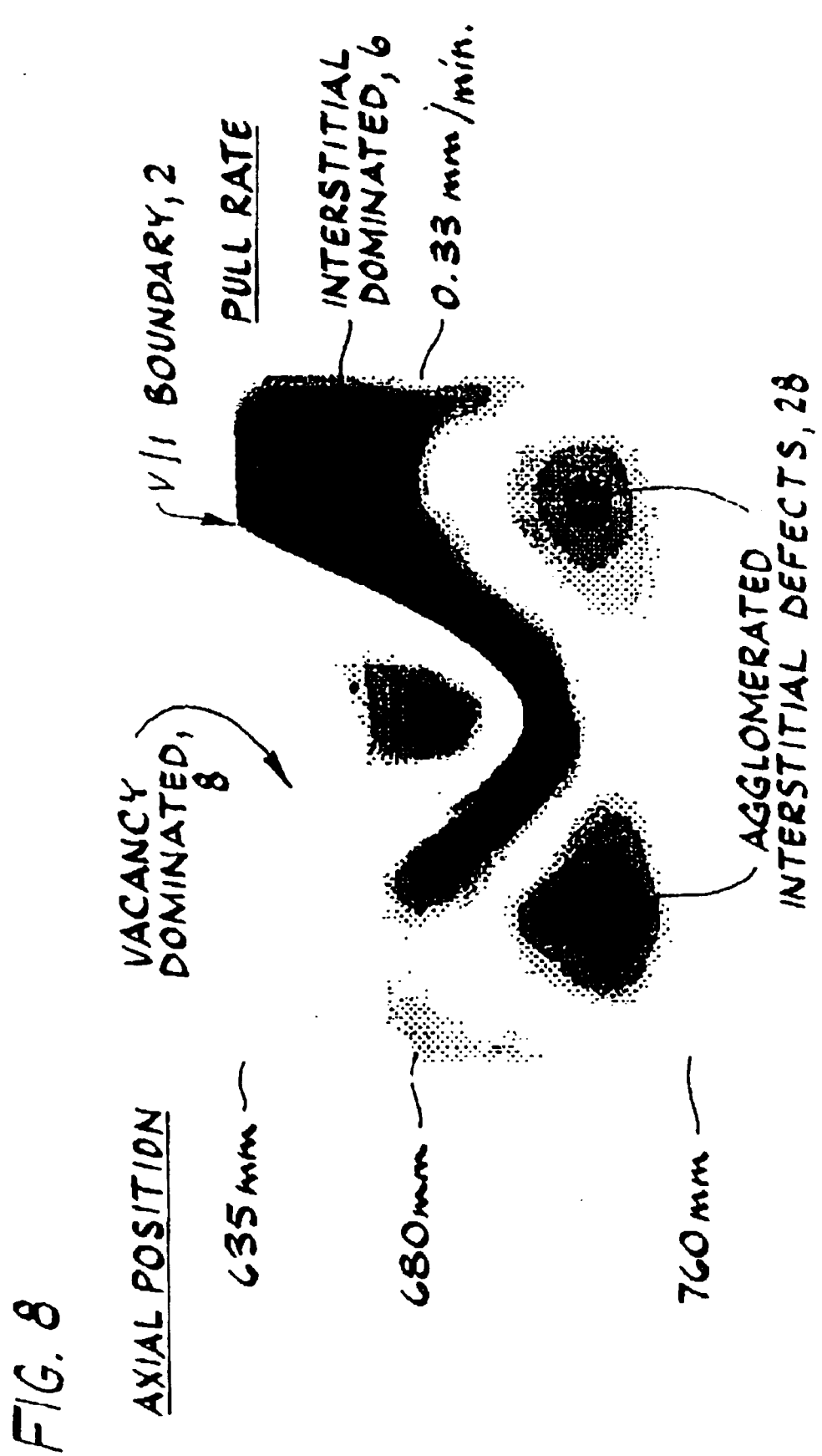
FIG. 8 is an image produced by a scan of the minority carrier lifetime of an axial cut of the ingot following a series of oxygen precipitation heat treatments, as described in Example 1.

FIG. 8 is an image produced by a scan of the minority carrier lifetime of an axial cut of the ingot over a section ranging from about 635 mm to about 760 mm from the shoulder of the ingot following a series of oxygen precipitation heat-treatments which reveal defect distribution patterns. At a crystal position of about 680 mm, a band of agglomerated interstitial defects 28 can be seen. This position corresponds to a critical pull rate of v*(680 mm)=0.33 mm/min. At this point, the width of the axially symmetric region 6 (a region which is interstitial dominated material but which lacks agglomerated interstitial defects) is at its maximum; the width of the vacancy dominated region 8, $R_v$*(680) is about 35 mm and the width of the axially symmetric region, $R_I$*(680) is about 65 mm.

Figure 9:
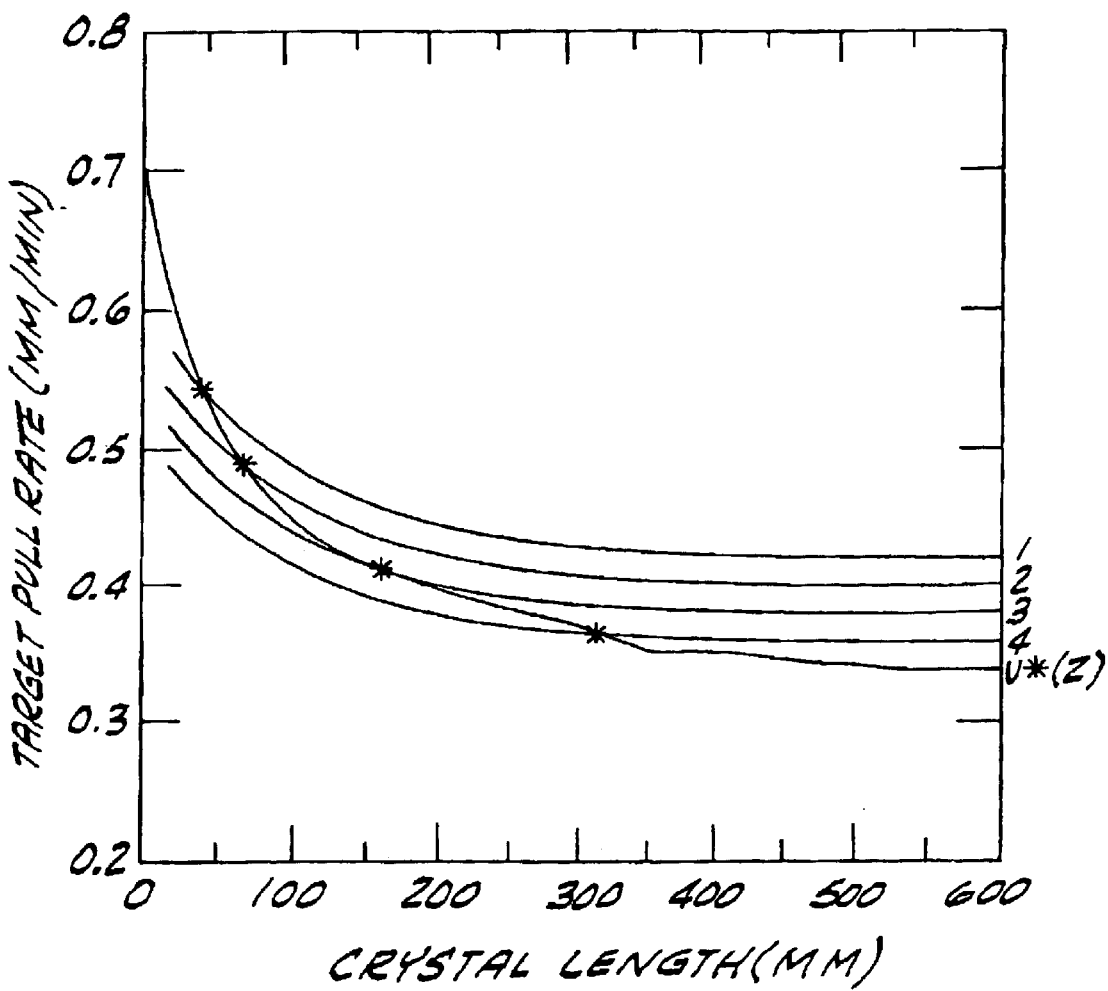
FIG. 9 is a graph of pull rate as a function of crystal length for each of four single crystal silicon ingots, labeled 1–4 respectively, which are used to yield a curve, labeled v*(Z), as described in Example 1.

A series of four single crystal silicon ingots were then grown at steady state pull rates which were somewhat greater than and somewhat less than the pull rate at which the maximum width of the axially symmetric region of the first 200 mm ingot was obtained. FIG. 9 shows the pull rate as a function of crystal length for each of the four crystals, labeled, respectively, as 1–4. These four crystals were then analyzed to determine the axial position (and corresponding pull rate) at which agglomerated interstitial defects first appear or disappear. These four empirically determined points (marked "*") are shown in FIG. 9. Interpolation between and extrapolation from these points yielded a curve, labeled v*(Z) in FIG. 9. This curve represents, to a first approximation, the pull rate for 200 mm crystals as a function of length in the crystal puller at which the axially symmetric region is at its maximum width. Growth of additional crystals at other pull rates and further analysis of these crystals would further refine the empirical definition of v*(Z)

Example 2

Reduction of Radial Variation in $G_0(r)$

Figure 10:
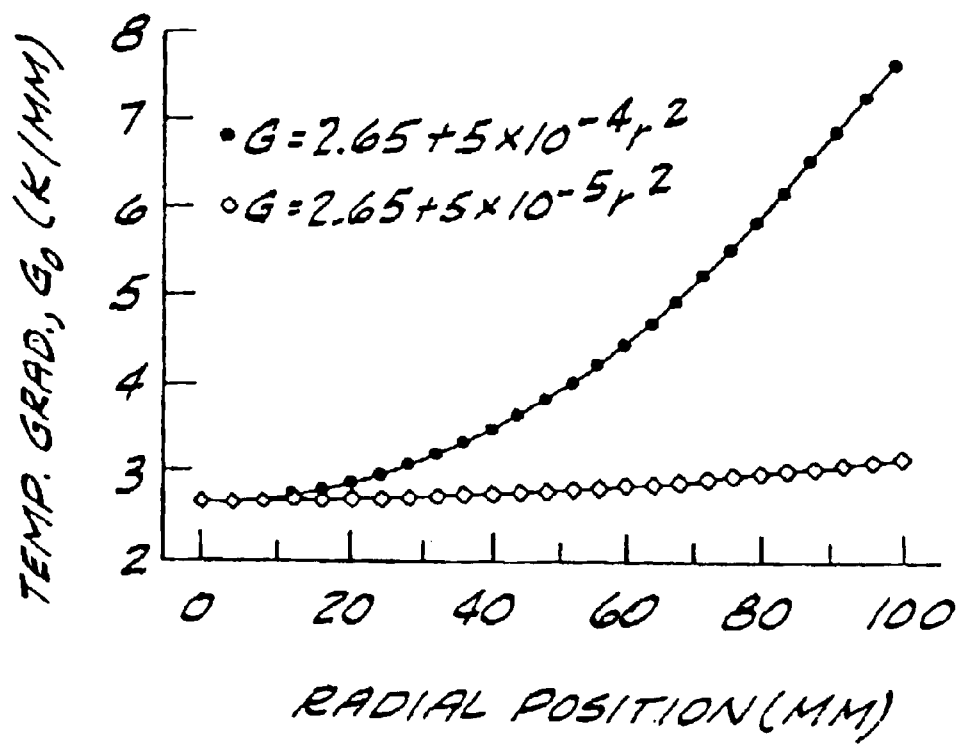
FIG. 10 is a graph of the average axial temperature gradient at the melt/solid interface, $G_0$, as a function of radial position, for two different cases as described in Example 2.
Figure 11:
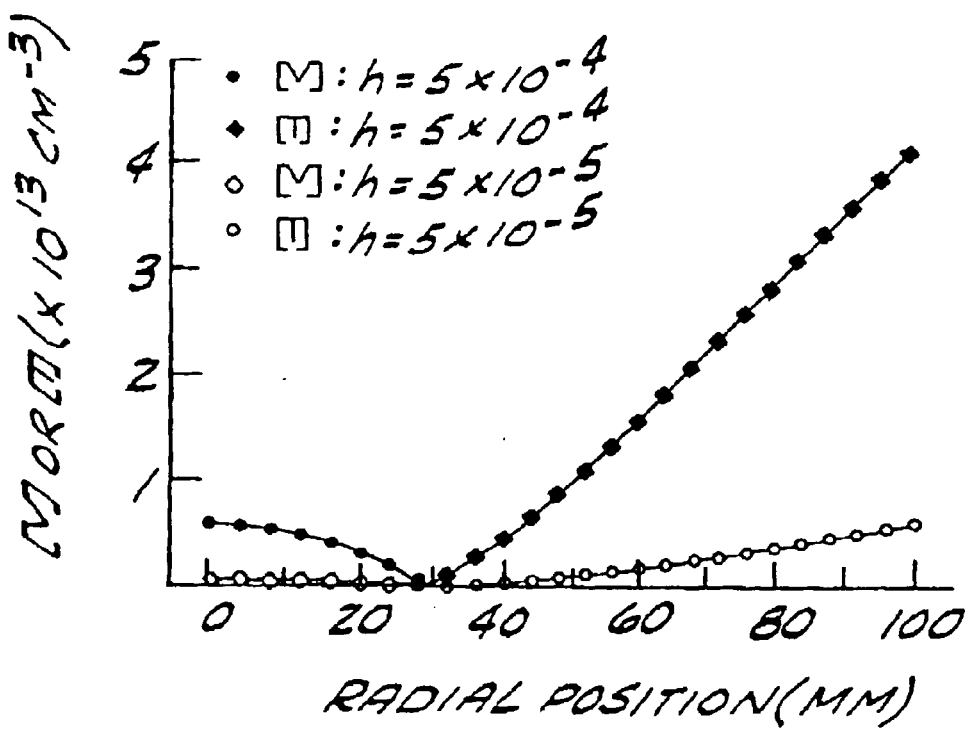
FIG. 11 is a graph of the initial concentration of vacancies, [V], or self-interstitials, [I], as a function of radial position, for two different cases as described Example 2.

FIGS. 10 and 11 illustrate the improvement in quality that can be achieved by reduction of the radial variation in the axial temperature gradient at the melt/solid interface, $G_0(r)$. The initial concentration (about 1 cm from the melt/solid interface) of vacancies and interstitials are calculated for two cases with different $G_0(r)$: (1) $G_0(r)=2.65+5\times10^{-4}r^2$ (K/mm) and (2) $G_0(r)=2.65+5\times10^{-5}r^2$ (K/mm). For each case the pull rate was adjusted such that the boundary between vacancy-rich silicon and interstitial-rich silicon is at a radius of 3 cm. The pull rate used for case 1 and 2 were 0.4 and 0.35 mm/min, respectively. From FIG. 11 it is clear that the initial concentration of interstitials in the interstitial-rich portion of the crystal is dramatically reduced as the radial variation in the initial axial temperature gradient is reduced. This leads to an improvement in the quality of the material since it becomes easier to avoid the formation of interstitial defect clusters due to supersaturation of interstitials.

Example 3

Increased Out-diffusion Time for Interstitials

Figure 12:
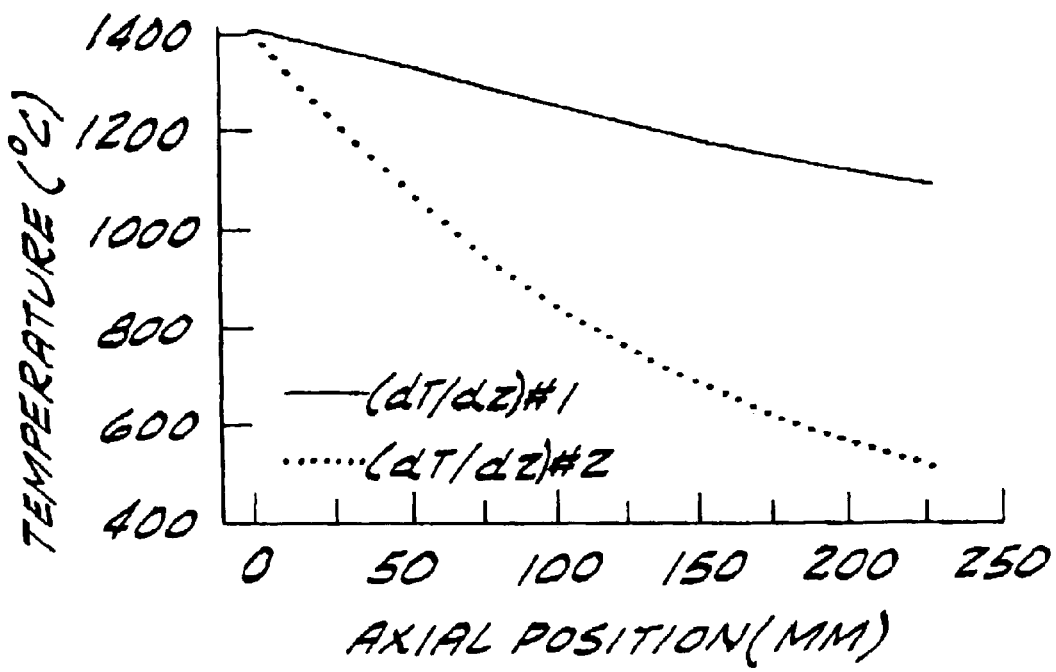
FIG. 12 is a graph of temperature as a function of axial position, showing the axial temperature profile in ingots for two different cases as described in Example 3.
Figure 13:
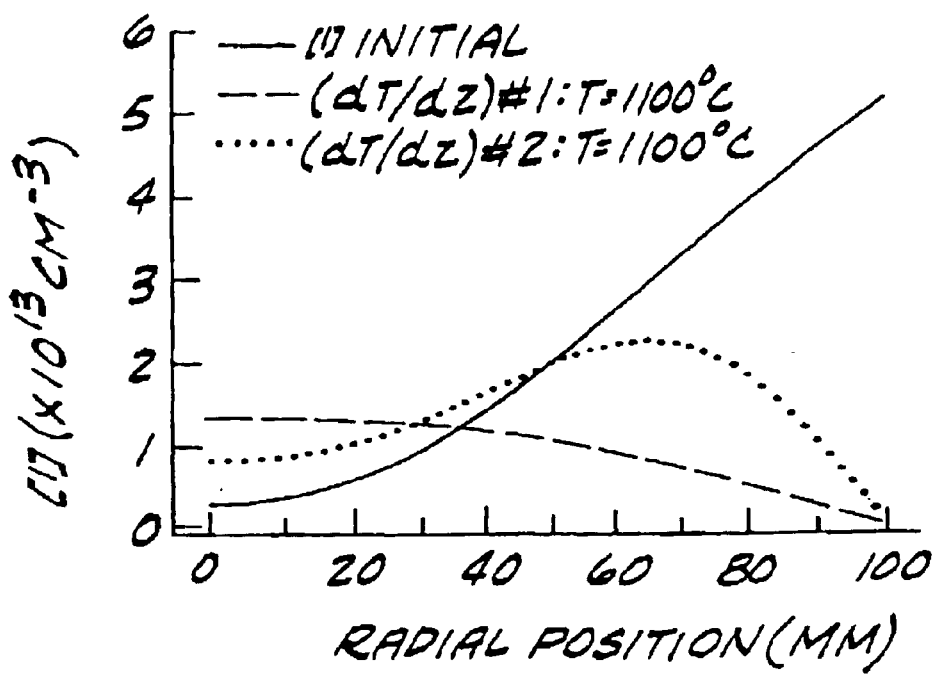
FIG. 13 is a graph of the self-interstitial concentrations resulting from the two cooling conditions illustrated in FIG. 12 and as more fully described in Example 3.

FIGS. 12 and 13 illustrate the improvement in quality that can be achieved by increasing the time for out-diffusion of interstitials. The concentration of interstitials is calculated for two cases with differing axial temperature profiles in the crystal, dT/dz. The axial temperature gradient at the melt/solid interface is the same for both cases, so that the initial concentration (about 1 cm from the melt/solid interface) of interstitials is the same for both cases. In this example, the pull rate was adjusted such that the entire crystal is interstitial-rich. The pull rate was the same for both cases, 0.32 mm/min. The longer time for interstitial out-diffusion in case 2 results in an overall reduction of the interstitial concentration. This leads to an improvement in the quality of the material since it becomes easier to avoid the formation of interstitial defect clusters due to supersaturation of interstitials

Example 4

A 700 mm long, 150 mm diameter crystal was grown a with a varying pull rate. The pull rate varied nearly linearly from about 1.2 mm/min at the shoulder to about 0.4 mm/min at 430 mm from the shoulder, and then nearly linearly back to about 0.65 mm/min at 700 mm from the shoulder. Under these conditions in this particular crystal puller, the entire radius is grown under interstitial-rich conditions over the length of crystal ranging from about 320 mm to about 525 mm from the shoulder of the crystal. Referring to FIG. 14, at an axial position of about 525 mm and a pull rate of about 0.47 mm/min, the crystal is free of agglomerated intrinsic point defects clusters across the entire diameter. Stated another way, there is one small section of the crystal in which the width of the axially symmetric region, i.e., the region which is substantially free of agglomerated defects, is equal to the radius of the ingot.

Example 5

As described in Example 1, a series of single crystal silicon ingots were grown at varying pull rates and then analyzed to determine the axial position (and corresponding pull rate) at which agglomerated interstitial defects first appeared or disappeared. Interpolation between and extrapolation from these points, plotted on a graph of pull rate v. axial position, yielded a curve which represents, to a first approximation, the pull rate for a 200 mm crystal as a function of length in the crystal puller at which the axially symmetric region is at its maximum width. Additional crystals were then grown at other pull rates and further analysis of these crystals was used to refine this empirically determined optimum pull rate profile.

Using this data and following this optimum pull rate profile, a crystal of about 1000 mm in length and about 200 mm in diameter was grown. Slices of the grown crystal, obtained from various axial position, were then analyzed using oxygen precipitation methods standard in sly the art in order to (i) determine if agglomerated interstitial defects were formed, and (ii) determine, as a function of the radius of the slice, the position of the V/I boundary. In this way the presence of an axially symmetric region was determined, as well as the width of this region a function of crystal length or position.

Figure 15:
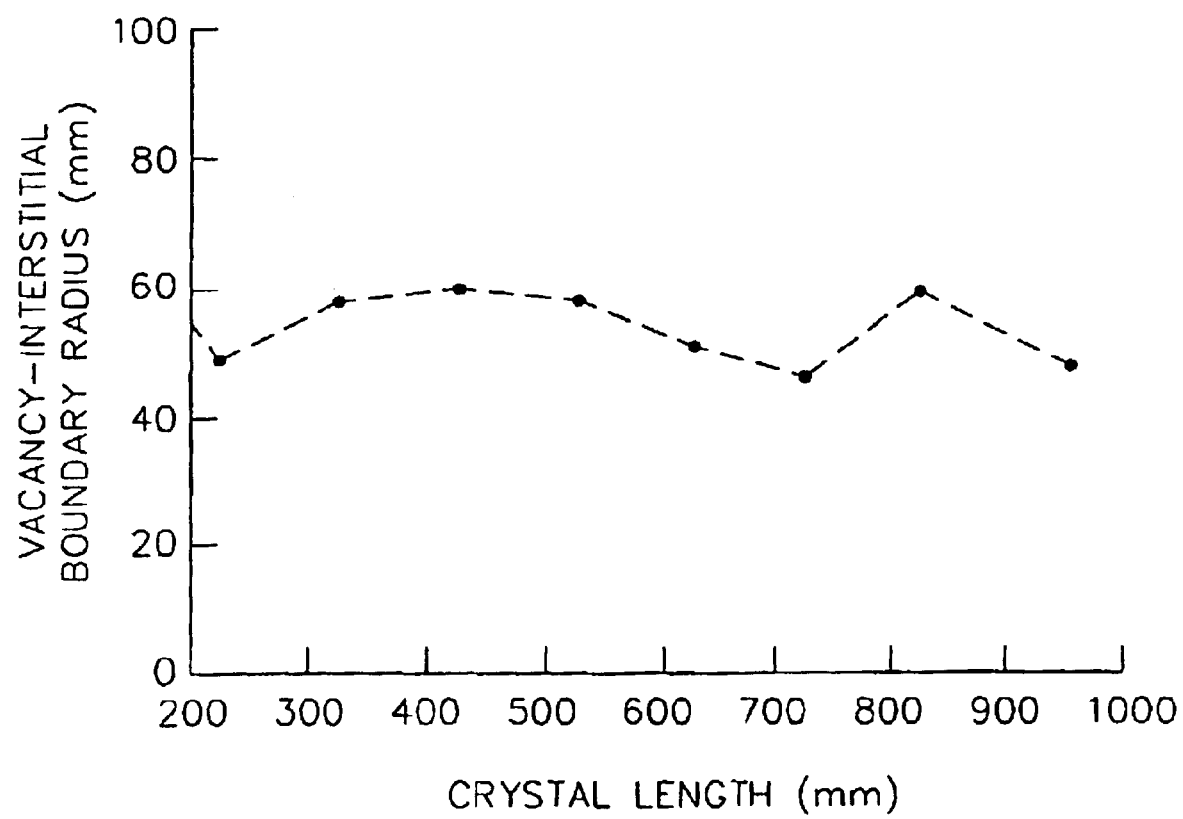
FIG. 15 is a graph illustrating the position of the V/I boundary as a function of the length of the single crystal silicon ingot, as described in Example 5.

The results obtained for axial positions ranging from about 200 mm to about 950 mm from the shoulder of the ingot are present in the graph of FIG. 15. These results show that a pull rate profile may be determined for the growth of a single crystal silicon ingot such that the constant diameter portion of the ingot may contain an axially symmetric region having a width, as measured from the circumferential edge radially toward the central axis of the ingot, which is at least about 40% the length of the radius of the constant diameter portion. In addition, these results show that this axially symmetric region may have a length, as measured along the central axis of the ingot, which is about 75% of the length of the constant diameter portion of the ingot.

Example 6

A single crystal silicon ingot having a length of about 1100 mm and a diameter of about 150 mm was grown with a decreasing pull rate. The pull rate at the shoulder of the constant diameter portion of the ingot was about 1 mm/min. The pull rate decreased exponentially to about 0.4 mm/min., which corresponded to an axial position of about 200 mm from the shoulder. The pull rate then decreased linearly until a rate of about 0.3 mm/min. was reached near the end of the constant diameter portion of the ingot.

Figure 16A:
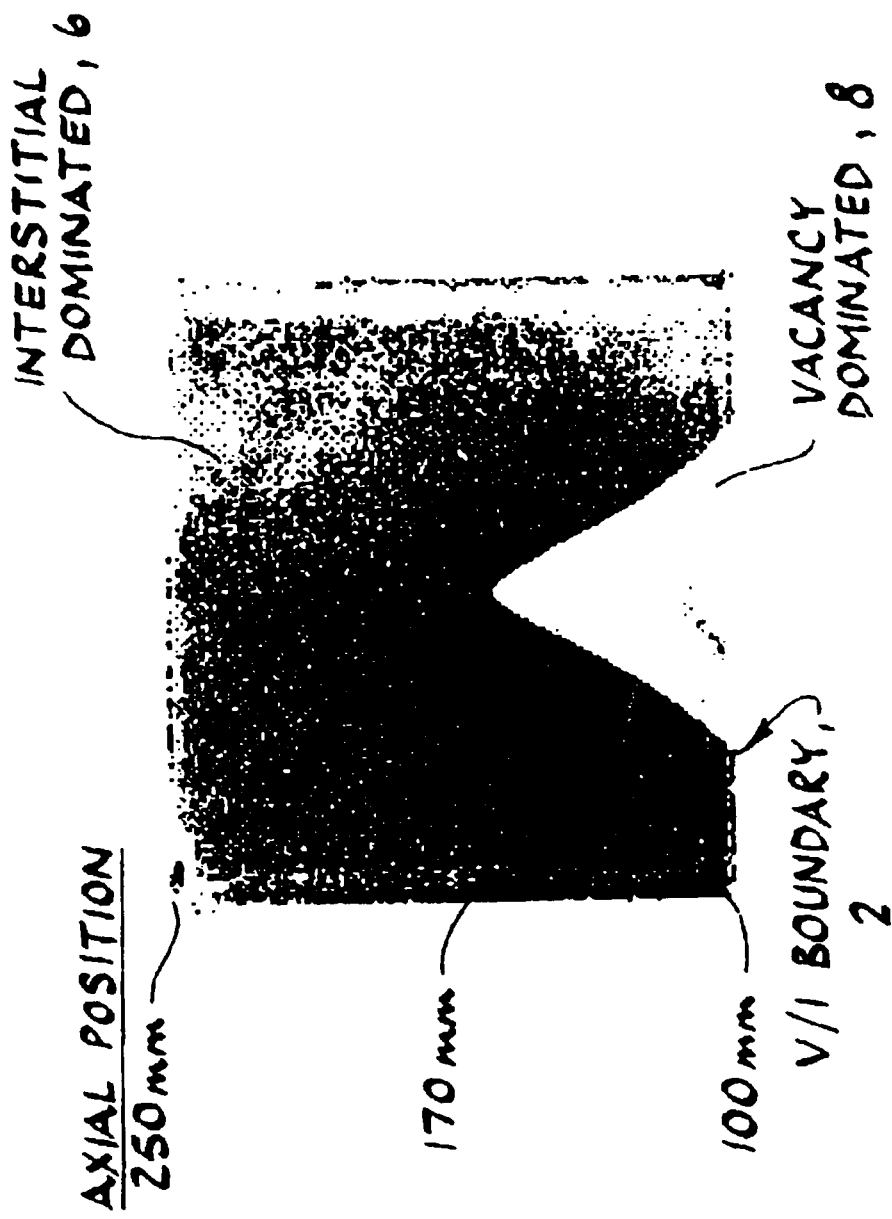
FIG. 16a is an image produced by a scan of the minority carrier lifetime of an axial cut of a segment of an ingot, ranging from about 100 mm to about 250 mm from the shoulder of the ingot, following a series of oxygen precipitation heat treatments, as described in Example 6.
Figure 16B:
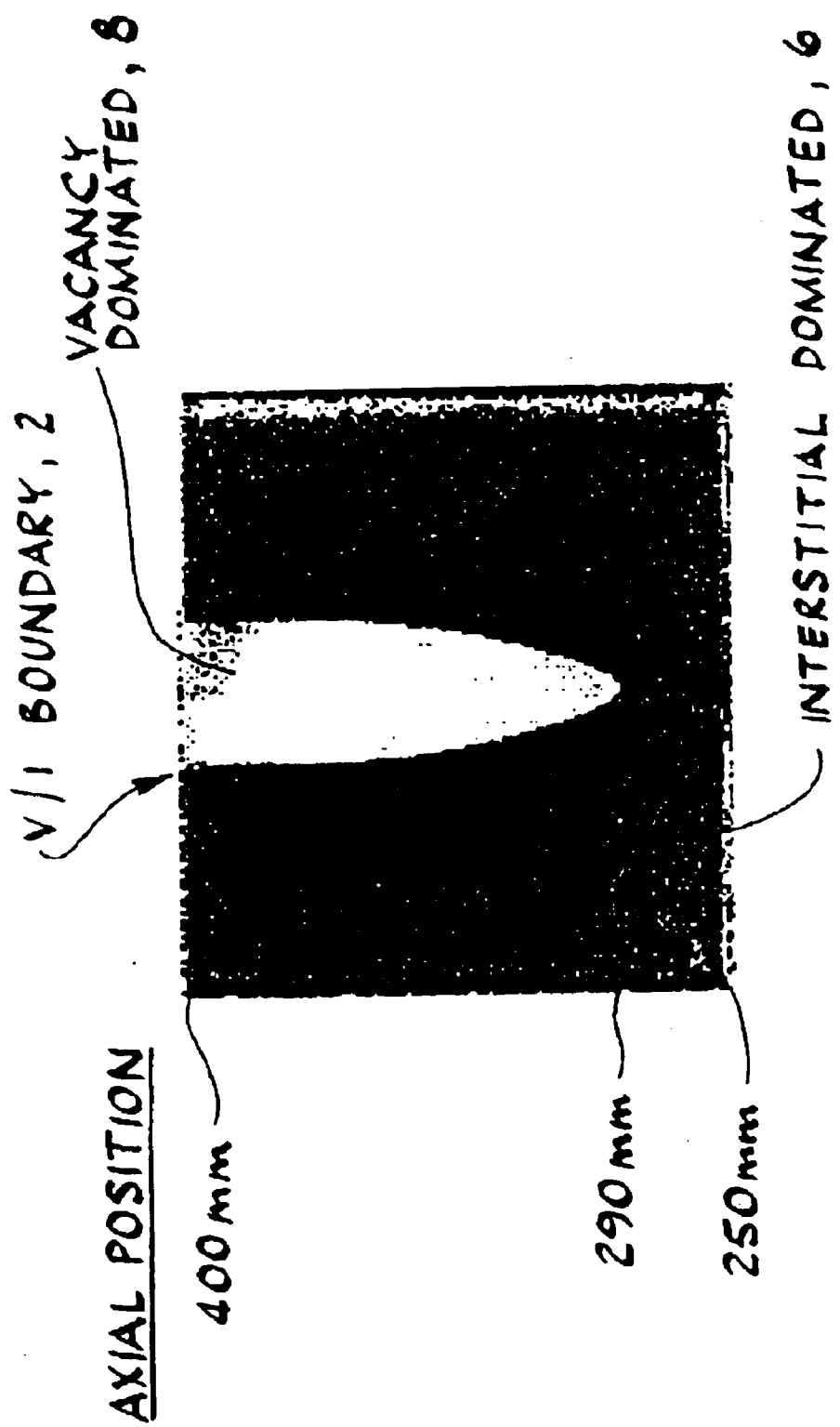
FIG. 16b is an image produced by a scan of the minority carrier lifetime of an axial cut of a segment of an ingot, ranging from about 250 mm to about 400 mm from the shoulder of the ingot, following a series of oxygen precipitation heat treatments, as described in Example 6.

Under these process conditions in this particular hot zone configuration, the resulting ingot contains a region wherein the axially symmetric region has a width which about equal to the radius of the ingot. Referring now to FIGS. 16a and 16b, which are images produced by a scan of the minority carrier lifetime of an axial cut of a portion of the ingot following a series of oxygen precipitation heat treatments, consecutive segments of the ingot, ranging in axial position from about 100 mm to about 250 mm and about 250 mm to about 400 mm are present. It can be seen from these figures that a region exists within the ingot, ranging in axial position from about 170 mm to about 290 mm from the shoulder, which is free of agglomerated intrinsic point defects across the entire diameter. Stated another way, a region is present within the ingot wherein the width of the axially symmetric region, i.e., the region which is substantially free of agglomerated interstitial defects, is about equal to the radius of the ingot.

In addition, in a region ranging from an axial position from about 125 mm to about 170 mm and from about 290 mm to greater than 400 mm there are axially symmetric regions of interstitial dominated material free of agglomerated intrinsic point defects surrounding a generally cylindrical core of vacancy dominated material which is also free of agglomerated intrinsic point defects.

Finally, in a region ranging from an axial position from about 100 mm to about 125 mm there is an axially symmetric region of interstitial dominated material free of agglomerated defects surrounding a generally cylindrical core of vacancy dominated material. Within the vacancy dominated material, there is an axially symmetric region which is free of agglomerated defects surrounding a core containing agglomerated vacancy defects.

Example 7

Cooling Rate and Position of V/I Boundary

A series of single crystal silicon ingots (150 mm and 200 mm nominal diameters), were grown in accordance with the Czochralski method using different hot zone configurations, designed by means common in the art, which affected the residence time of the silicon at temperatures in excess of about 1050° C. The pull rate profile for each ingot was varied along the length of the ingot in an attempt to create a transition from a region of agglomerated vacancy point defects to a region of agglomerated interstitial point defects.

Once grown, the ingots were cut longitudinally along the central axis running parallel to the direction of growth, and then further divided into sections which were each about 2 mm in thickness. Using the copper decoration technique previously described, one set of such longitudinal sections was then heated and intentionally contaminated with copper, the heating conditions being appropriate for the dissolution of a high concentration of copper interstitials. Following this heat treatment, the samples were then rapidly cooled, during which time the copper impurities either out diffused or precipitated at sites where oxide clusters or agglomerated interstitial defects where present. After a standard defect delineating etch, the samples were visually inspected for the presence of precipitated impurities; those regions which were free of such precipitated impurities corresponded to regions which were free of agglomerated interstitial defects.

Another set of the longitudinal sections was subjected to a series of oxygen precipitation heat treatments in order to cause the nucleation and growth of new oxide clusters prior to carrier lifetime mapping. Contrast bands in lifetime mapping were utilized in order to determine and measure the shape of the instantaneous melt/solid interface at various axial positions in each ingot. Information on the shape of the melt/solid interface was then used, as discussed further below, to estimate the absolute value of, and the radial variation in, the average axial temperature gradient, $G_0$. This information was also used, in conjunction with the pull rate, to estimate the radial variation in $V/G_0$.

To more closely examine the effect growth conditions have on the resulting quality of a single crystal silicon ingot, several assumptions were made which, based on experimental evidence available to-date, are believed to be justified. First, in order to simplify the treatment of thermal history in terms of the time taken to cool to a temperature at which the agglomeration of interstitial defects occurs, it was assumed that about 1050° C. is a reasonable approximation for the temperature at which the agglomeration of silicon self-interstitials occurs. This temperature appears to coincide with changes in agglomerated interstitial defect density observed during experiments in which different cooling rates were employed. Although, as noted above, whether agglomeration occurs is also a factor of the concentration of interstitials, it is believed that agglomeration will not occur at temperatures above about 1050° C. because, given the range of interstitial concentrations typical for Czochralski-type growth processes, it is reasonable to assume that the system will not become critically supersaturated with interstitials above this temperature. Stated another way, for concentrations of interstitials which are typical for Czochralski-type growth processes, it is reasonable to assume that the system will not become critically supersaturated, and therefore an agglomeration event will not occur, above a temperature of about 1050° C.

The second assumption that was made to parameterize the effect of growth conditions on the quality of single crystal silicon is that the temperature dependence of silicon self-interstitial diffusivity is negligible. Stated another way, it is assumed that self-interstitials diffuse at the same rate at all temperatures between about 1400° C. and about 1050° C. Understanding that about 1050° C. is considered a reasonable approximation for the temperature of agglomeration, the essential point of this assumption is that the details of the cooling curve from the melting point does not matter. The diffusion distance depends only on the total time spent cooling from the melting point to about 1050° C.

Using the axial temperature profile data for each hot zone design and the actual pull rate profile for a particular ingot, the total cooling time from about 1400° C. to about 1050° C. may be calculated. It should be noted that the rate at which the temperature changes for each of the hot zones was reasonably uniform. This uniformity means that any error in the selection of a temperature of nucleation for agglomerated interstitial defects, i.e., about 1050° C., will arguably lead only to scaled errors in the calculated cooling time.

Figure 17:
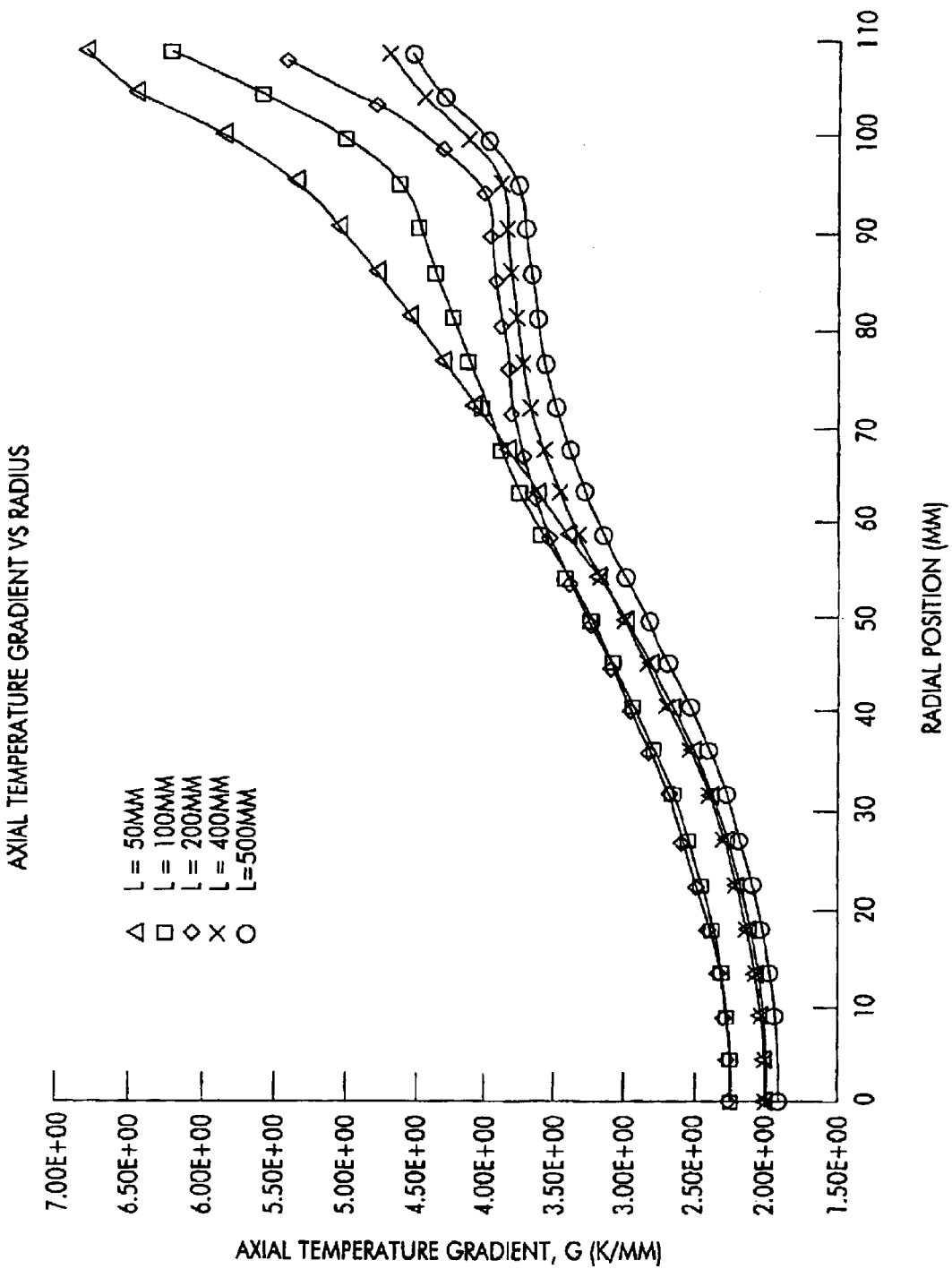
FIG. 17 is a graph of the axial temperature gradient, $G_0$, at various axial positions for an ingot, as described in Example 7.

In order to determine the radial extent of the vacancy dominated region of the ingot ($_{vacancy}$), or alternatively the width of the axially symmetric region, it was further assumed that the radius of the vacancy dominated core, as determined by the lifetime map, is equivalent to the point at solidification where $v/G_0 = v/G_0$ critical. Stated another way, the width of the axially symmetric region was generally assumed to be based on the position of the V/I boundary after cooling to room temperature. This is pointed out because, as mentioned above, as the ingot cools recombination of vacancies and silicon self-interstitials may occur. When recombination does occur, the actual position of the V/I boundary shifts inwardly toward the central axis of the ingot. It is this final position which is being referred to here. To simplify the calculation of $G_0$, the average axial temperature gradient in the crystal at the time of solidification, the melt/solid interface shape was assumed to be the melting point isotherm. The crystal surface temperatures were calculated using finite element modeling (FEA) techniques and the details of the hot zone design. The entire temperature field within the crystal, and therefore $G_0$, was deduced by solving Laplace's equation with the proper boundary conditions, namely, the melting point along the melt/solid interface and the FEA results for the surface temperature along the axis of the crystal. The results obtained at various axial positions from one of the ingots prepared and evaluated are presented in FIG. 17.

To estimate the effect that radial variations in $G_0$ have on the initial interstitial concentration, a radial position R', that is, a position halfway between the V/I boundary and the crystal surface, was assumed to be the furthest point a silicon self-interstitial can be from a sink in the ingot, whether that sink be in the vacancy dominated region or on the crystal surface. By using the growth rate and the $G_0$ data for the above ingot, the difference between the calculated $v/G_0$ at the position, R' and $v/G_0$ at the V/I boundary (i.e., the critical $v/G_0$ value) provides an indication of the radial variation in the initial interstitial concentration, as well as the effect this has on the ability for excess interstitials to reach a sink on the crystal surface or in the vacancy dominated region.

Figure 18:
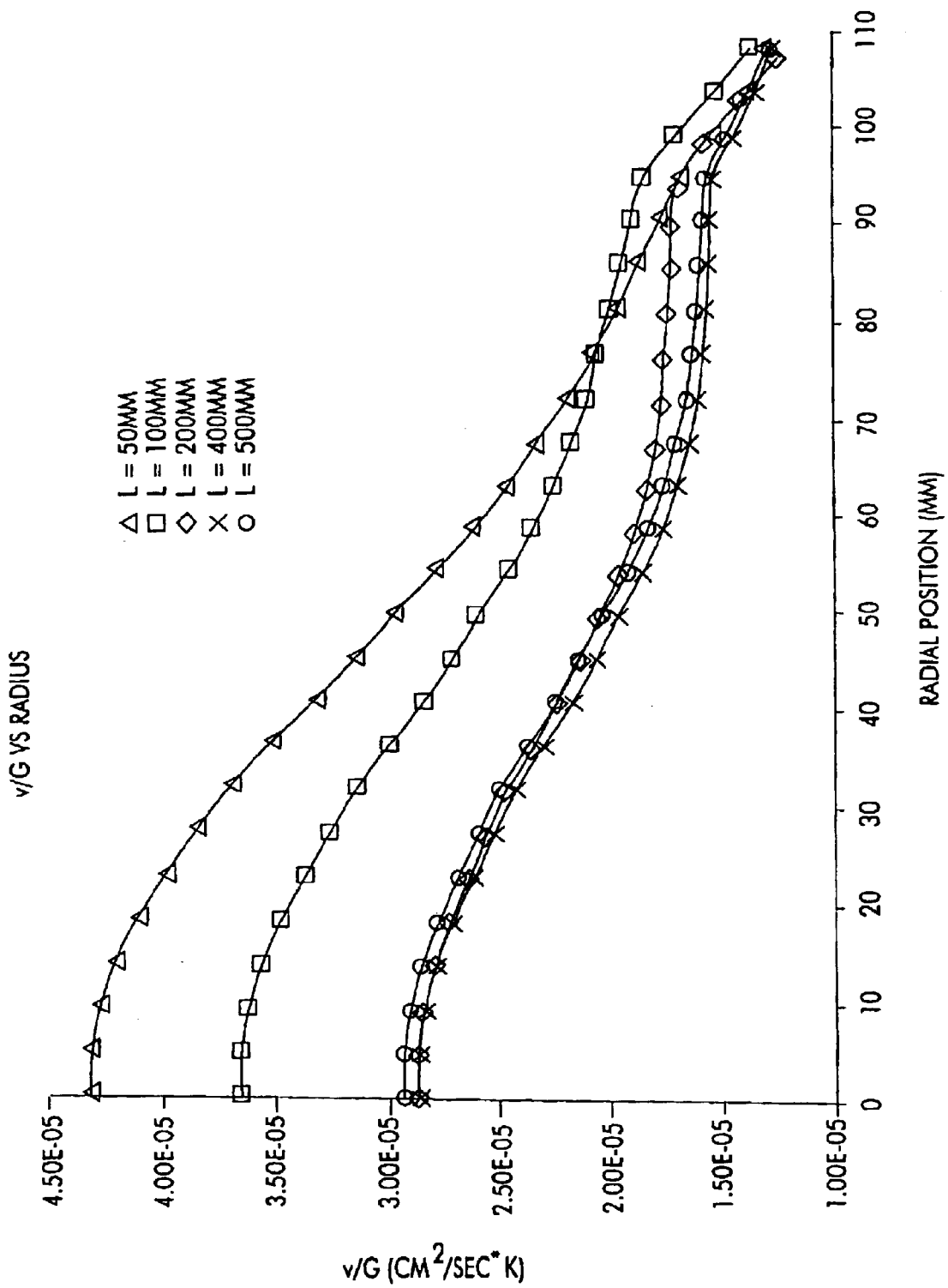
FIG. 18 is a graph of the radial variations in the average axial temperature gradient, $G_0$, at various for an ingot, as described in Example 7.

For this particular data set, it appears there is no systematic dependence of the quality of the crystal on the radial variation in $v/G_0$. As can be seen in FIG. 18, the axial dependence in the ingot is minimal in this sample. The growth conditions involved in this series of experiments represent a fairly narrow range in the radial variation of $G_0$. As a result, this data set is too narrow to resolve a discernable dependence of the quality (i.e., the presence of absence of a band of agglomerated intrinsic point defects) on the radial variation of $G_0$.

Figure 19:
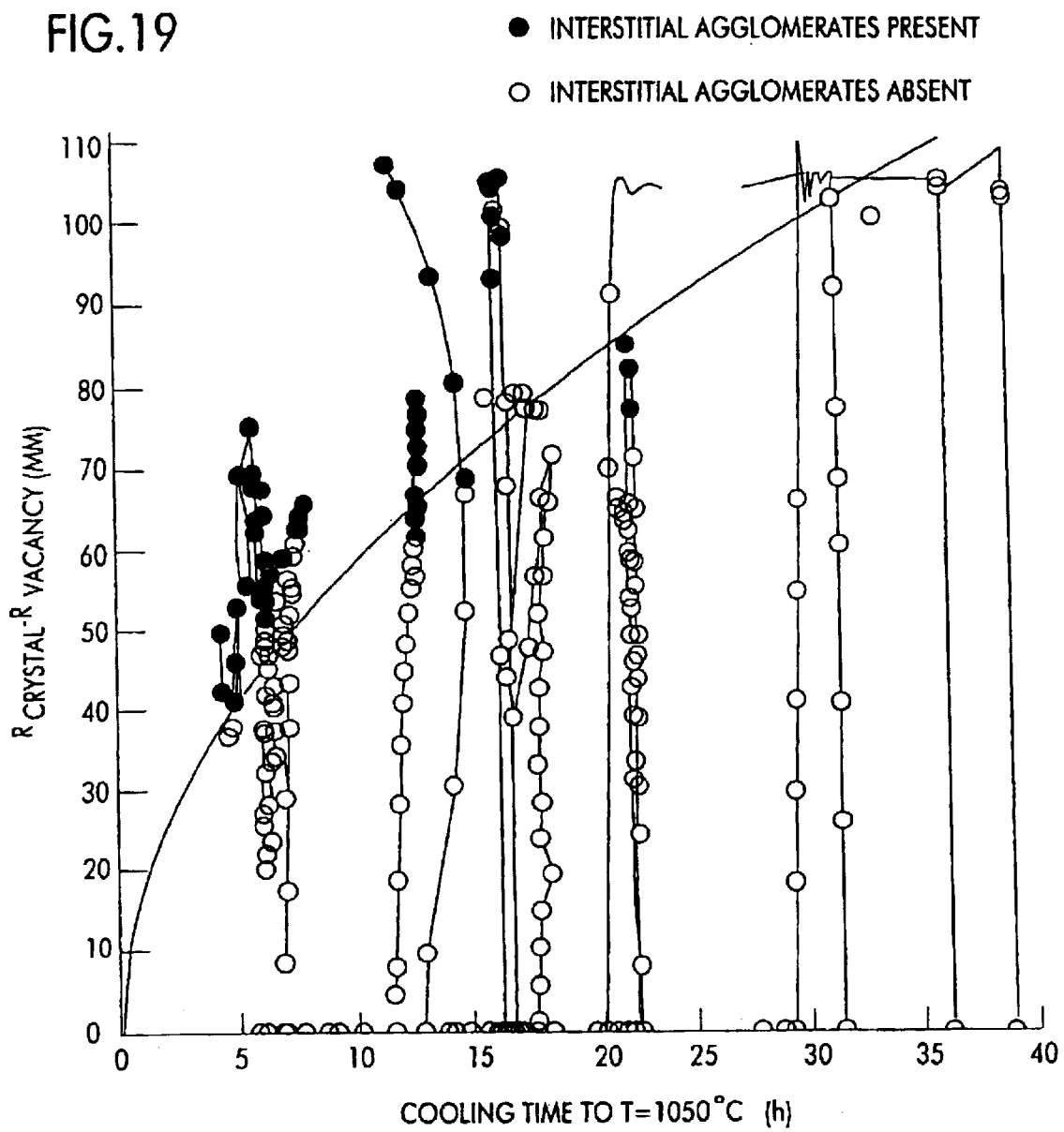
FIG. 19 is a graph illustrating the relationship between the width of the axially symmetric region and the cooling rate, as described in Example 7.

As noted, samples of each ingot prepared were evaluated at various axial positions for the present or absence of agglomerated interstitial defects. For each axial position examined, a correlation may be made between the quality of the sample and the width of the axially symmetric region. Referring now to FIG. 19, a graph may be prepared which compares the quality of the given sample to the time the sample, at that particular axial position, was allowed to cool from solidification to about 1050° C. As expected, this graph shows the width of the axially symmetric region (i.e., $R_{crystal}$–$R_{vacancy}$) has a strong dependence on the cooling history of the sample within this particular temperature range. In order of the width of the axially symmetric region to increase, the trend suggests that longer diffusion times, or slower cooling rates, are needed.

Based on the data present in this graph, a best fit line may be calculated which generally represents a transition in the quality of the silicon from "good" (i.e., defect-free) to "bad" (i.e., containing defects), as a function of the cooling time allowed for a given ingot diameter within this particular temperature range. This general relationship between the width of the axially symmetric region and the cooling rate may be expressed in terms of the following equation:

$$(R_{crystal} - R_{transition})^2 = D_{eff} * t_{1050° C}$$

wherein $R_{crystal}$ is the radius of the ingot, $R_{transition}$ is the radius of the axially symmetric region at an axial position in the sample where a transition occurs in the interstitial dominated material from being defect-free to containing defects, or vice versa, $D_{eff}$ is a constant, about $9.3*10^{-4}$ cm$^2$sec$^{-1}$, which represents the average time and temperature of interstitial diffusivity, and $t_{1050° C}$ is the time required for the given axial position of the sample to cool from solidification to about 1050° C.

Referring again to FIG. 19, it can be seen that, for a given ingot diameter, a cooling time may be estimated in order to obtain an axially symmetric region of a desired diameter. For example, for an ingot having a diameter of about 150 mm, an axially symmetric region having a width about equal to the radius of the ingot may be obtained if, between the temperature range of about 1410° C. and about 1050° C., this particular portion of the ingot is allowed to cool for about 10 to about 15 hours. Similarly, for an ingot having a diameter of about 200 mm, an axially symmetric region having a width about equal to the radius of the ingot may be obtained if between this temperature range this particular portion of the ingot is allowed to cool for about 25 to about 35 hours. If this line is further extrapolated, cooling times of about 65 to about 75 hours may be needed in order to obtain an axially symmetric region having a width about equal to the radius of an ingot having a diameter of about 300 mm. It is to be noted in this regard that, as the diameter of the ingot increases, additional cooling time is required due to the increase in distance that interstitials must diffuse in order to reach sinks at the ingot surface or the vacancy core.

Referring now to FIGS. 20, 21, 22 and 23, the effects of increased cooling time for various ingots may be observed. Each of these figures depicts a portion of an ingot having a nominal diameter of 200 mm, with the cooling time from the temperature of solidification to 1050° C. progressively increasing from FIG. 20 to FIG. 23.

Figure 20:
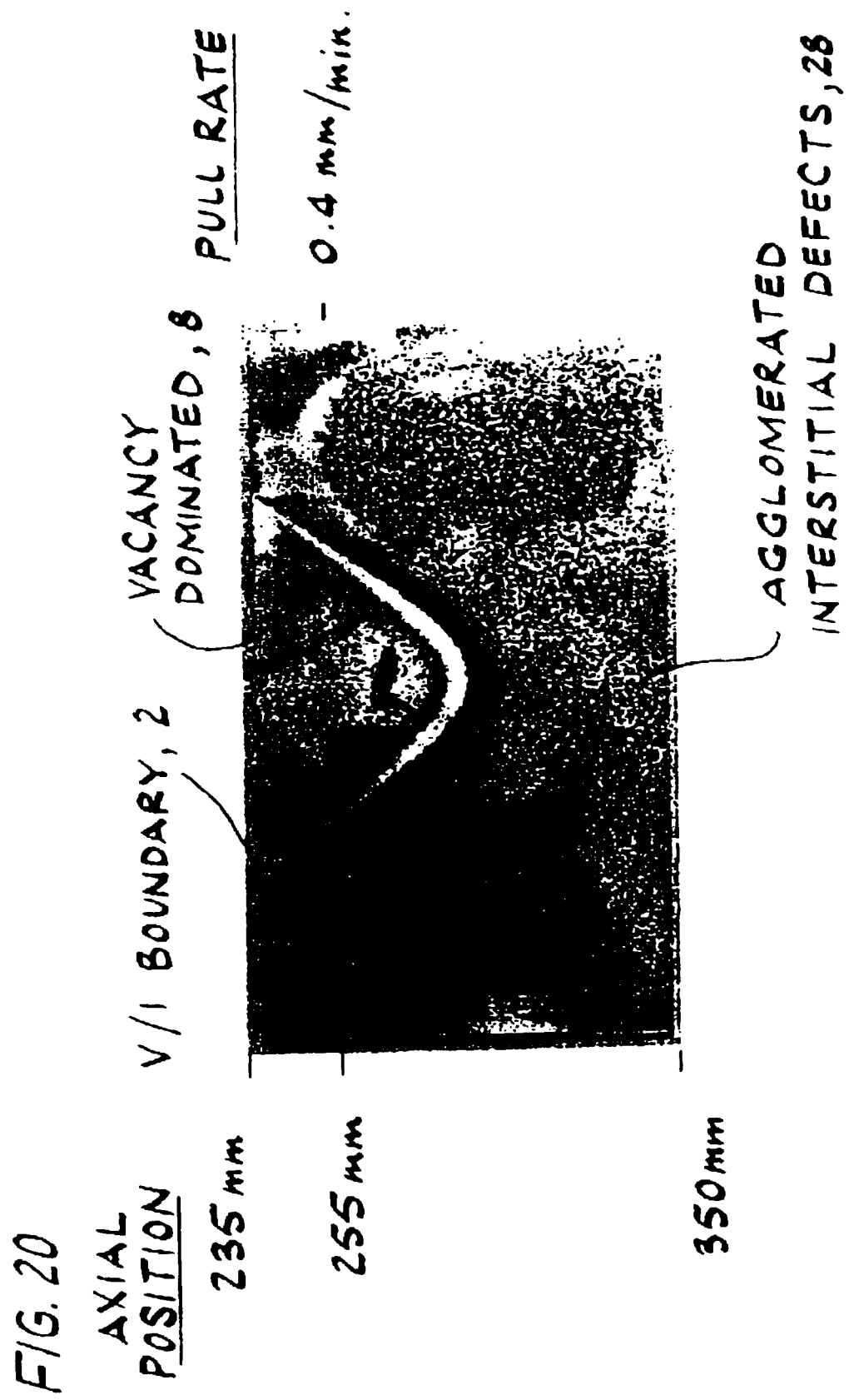
FIG. 20 is a photograph of an axial cut of a segment of an ingot, ranging from about 235 mm to about 350 mm in from the shoulder of the ingot, following copper decoration and a defect-delineating etch, described in Example 7.

Referring to FIG. 20, a portion of an ingot, ranging in axial position from about 235 mm to about 350 mm from the shoulder, is shown. At an axial position of about 255 mm, the width of the axially symmetric region free of agglomerated interstitial defects is at a maximum, which is about 45% of the radius of the ingot. Beyond this position, a transition occurs from a region which is free of such defects, to a region in which such defects are present.

Figure 21:
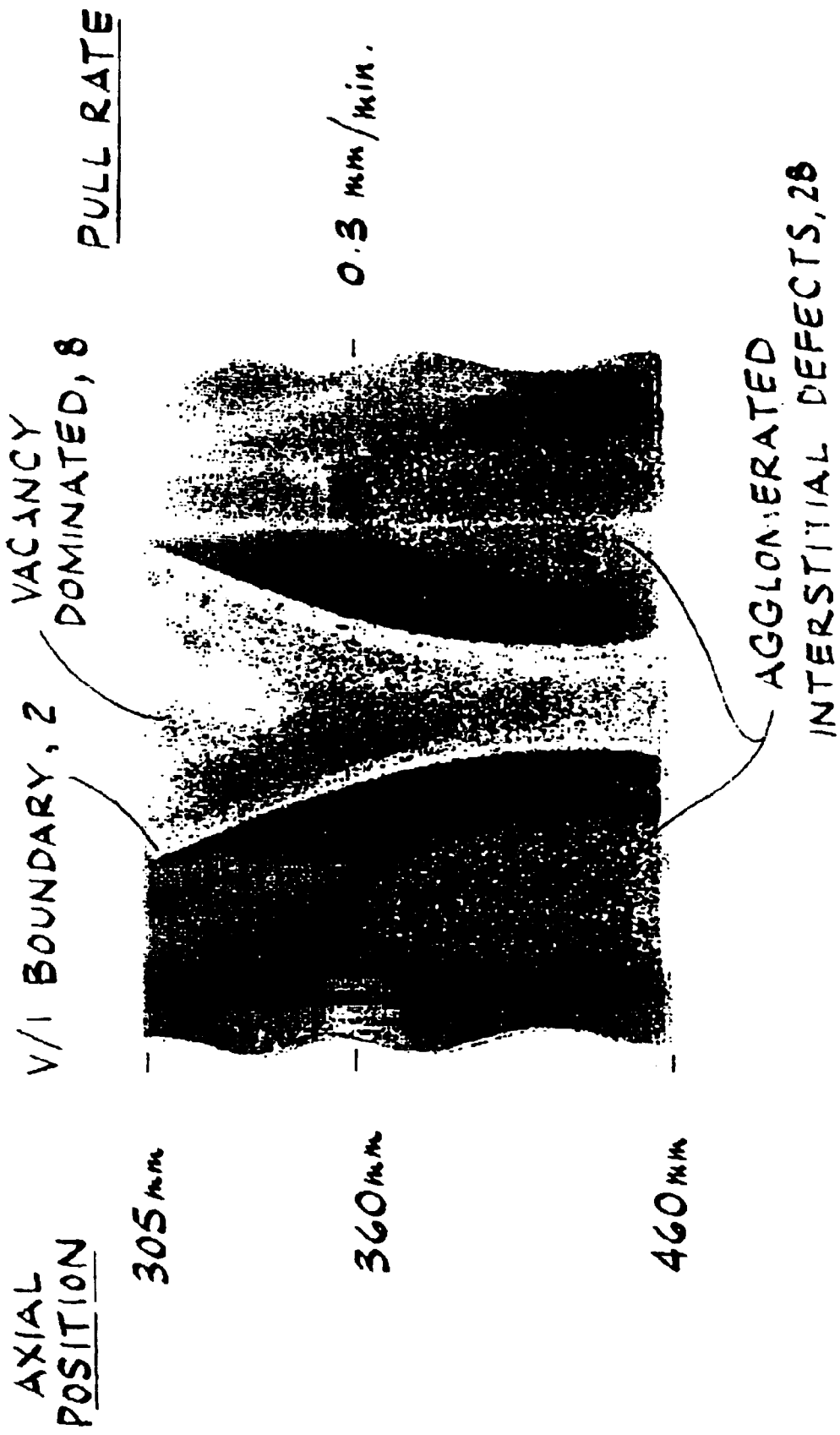
FIG. 21 is a photograph of an axial cut of a segment of an ingot, ranging from about 305 mm to about 460 mm from the shoulder of the ingot, following copper decoration and a defect-delineating etch, described in Example 7.

Referring now to FIG. 21, a portion of an ingot, ranging in axial position from about 305 mm to about 460 mm from the shoulder, is shown. At an axial position of about 360 mm, the width of the axially symmetric region free of agglomerated interstitial defects is at a maximum, which is about 65% of the radius of the ingot. Beyond this position, defect formation begins.

Figure 22:
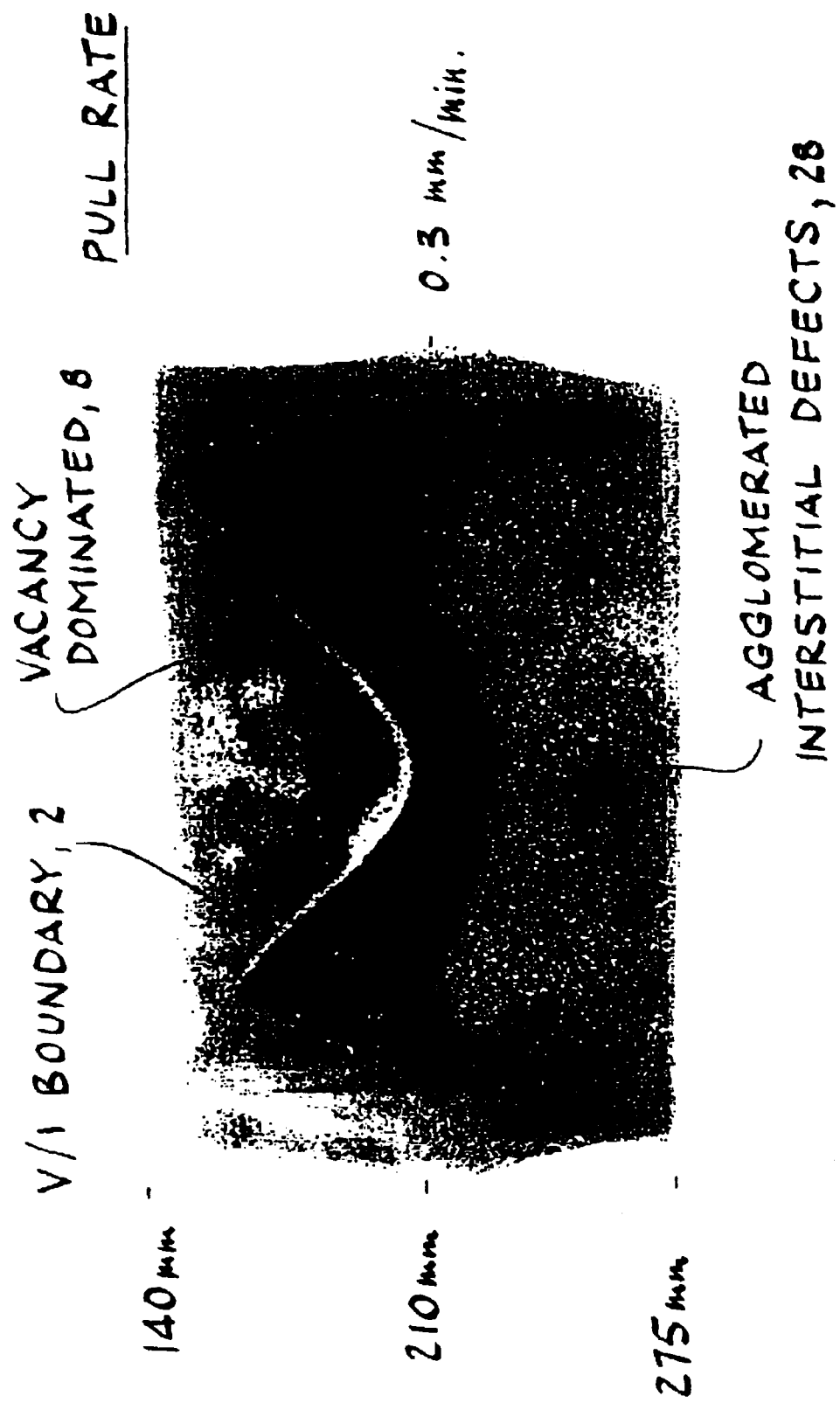
FIG. 22 is a photograph of an axial cut of a segment of an ingot, ranging from about 140 mm to about 275 mm from the shoulder of the ingot, following copper decoration and a defect-delineating etch, described in Example 7.

Referring now to FIG. 22, a portion of an ingot, ranging in axial position from about 140 mm to about 275 mm from the shoulder, is shown. At an axial position of about 210 mm, the width of the axially symmetric region is about equal to the radius of the ingot; that is, a small portion of the ingot within this range is free of agglomerated intrinsic point defects.

Figure 23:
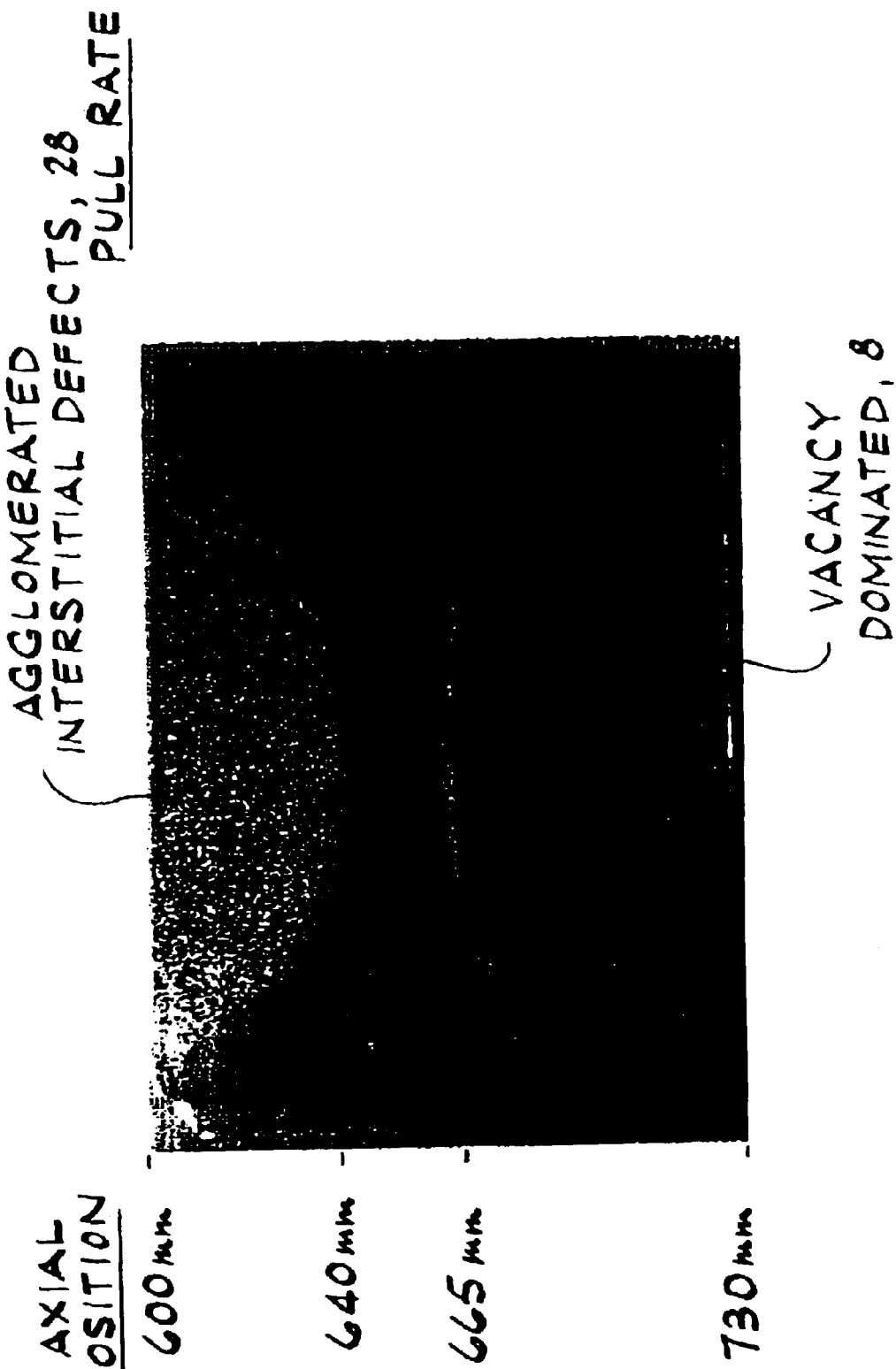
FIG. 23 is a photograph of an axial cut of a segment of an ingot, ranging from about 600 mm to about 730 mm from the shoulder of the ingot, following copper decoration and a defect-delineating etch, described in Example 7.
Figure 24:
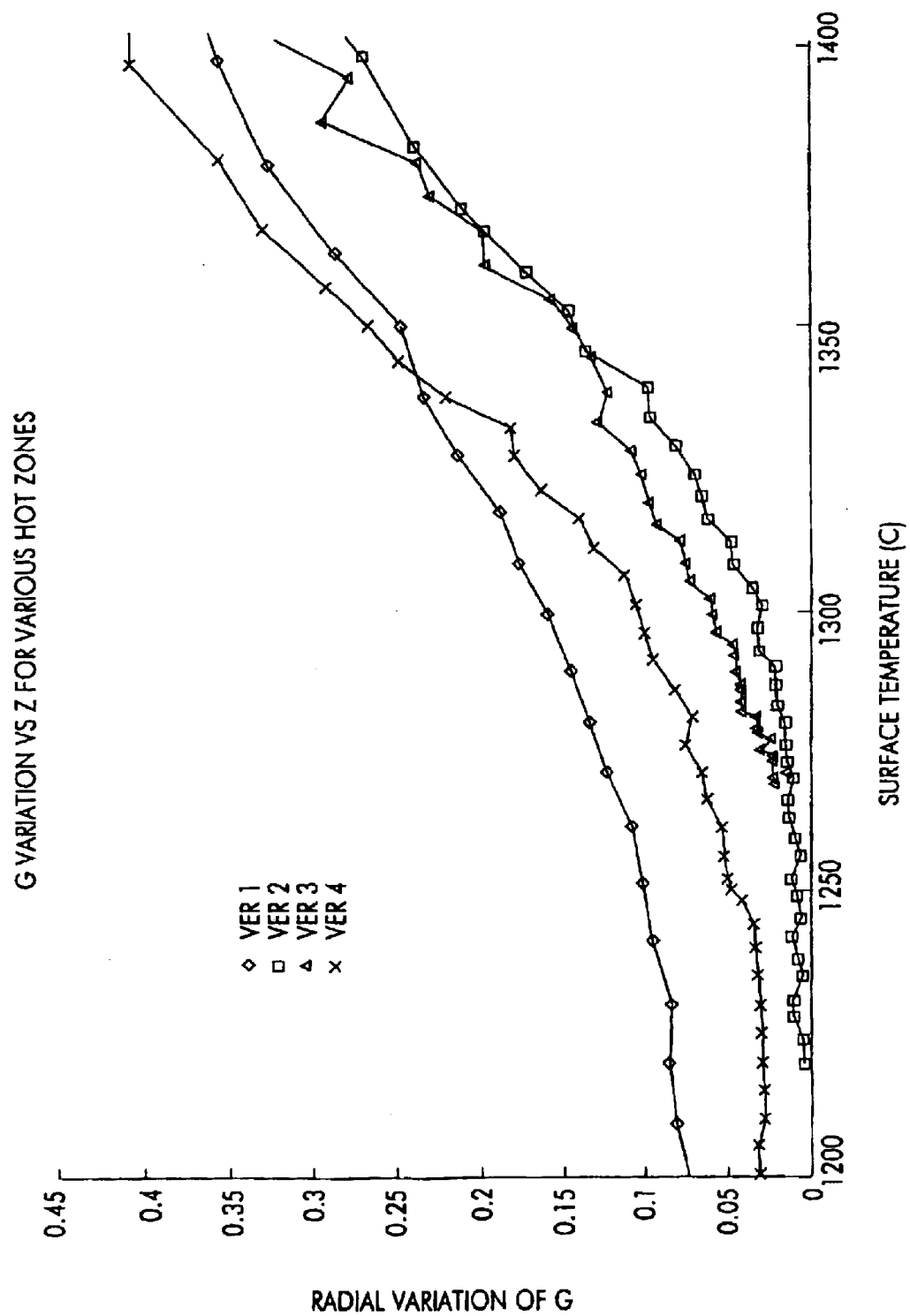
FIG. 24 is a graph illustrating the radial variations in the average axial temperature gradient, $G_0(r)$, from the center of the ingot to about one-half of the ingot radius (determined by averaging the gradient from the solidification temperature to the temperature on the x-axis), which may occur in hot zones of various configurations.
Figure 25:
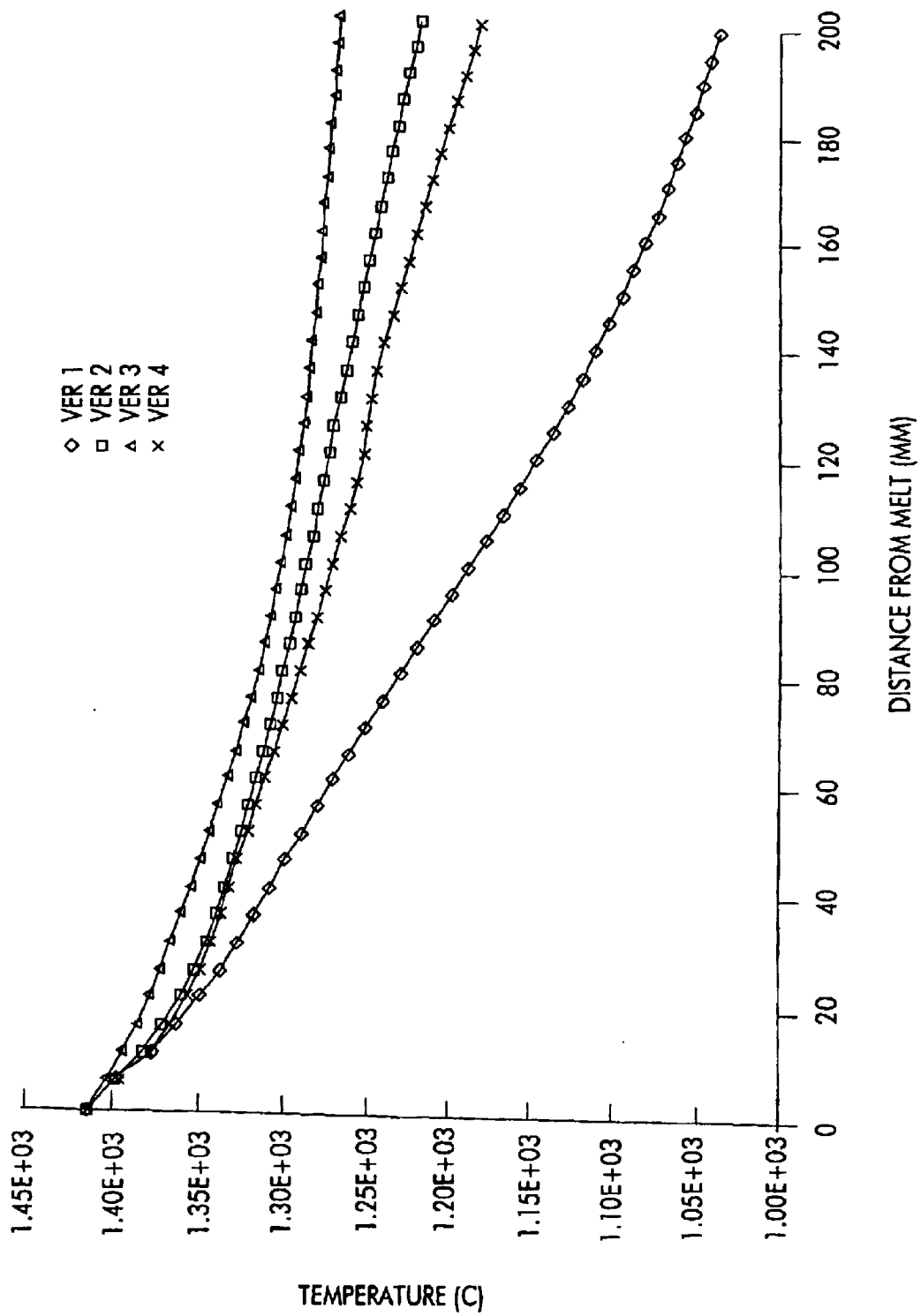
FIG. 25 is a graph illustrating the axial temperature profile for an ingot in four different hot zone configurations.

Referring now to FIG. 23, a portion of an ingot, ranging in axial position from about 600 mm to about 730 mm from the shoulder, is shown. Over an axial position ranging from about 640 mm to about 665 mm, the width of the axially symmetric region is about equal to the radius of the ingot. In addition, the length of the ingot segment in which the width of the axially symmetric region is about equal to the radius of the ingot is greater than what is observed in connection with the ingot of FIG. 22.

When viewed in combination, therefore, FIGS. 20, 21, 22, and 23 demonstrate the effect of cooling time to 1050° C. upon the width and the length of the defect-free, axially symmetric region. In general, the regions containing agglomerated interstitial defects occurred as a result of a continued decrease of the crystal pull rate leading to an initial interstitial concentration which was too large to reduce for the cooling time of that portion of the crystal. A greater length of the axially symmetric region means a larger range of pull rates (i.e., initial interstitial concentration) are available for the growth of such defect-free material. Increasing the cooling time allows for initially higher concentration of interstitials, as sufficient time for radial diffusion may be achieved to suppress the concentration below the critical concentration required for agglomeration of interstitial defects. Stated in other words, for longer cooling times, somewhat lower pull rates (and, therefore, higher initial interstitial concentrations) will still lead to a maximum axially symmetric region 6. Therefore, longer cooling times lead to an increase in the allowable pull rate variation about the condition required for maximum axially symmetric region diameter and ease the restrictions on process control. As a result, the process for an axially symmetric region over large lengths of the ingot becomes in easier.

Referring again to FIG. 23, over an axial position ranging from about 665 mm to greater than 730 mm from the shoulder of crystal, a region of vacancy dominated material free of agglomerated defects is present in which the width of the region is equal to the radius of the ingot.

Example 8

Thermal Anneal of Wafers with a Core of Agglomerated Vacancy Defects

Figure 26:
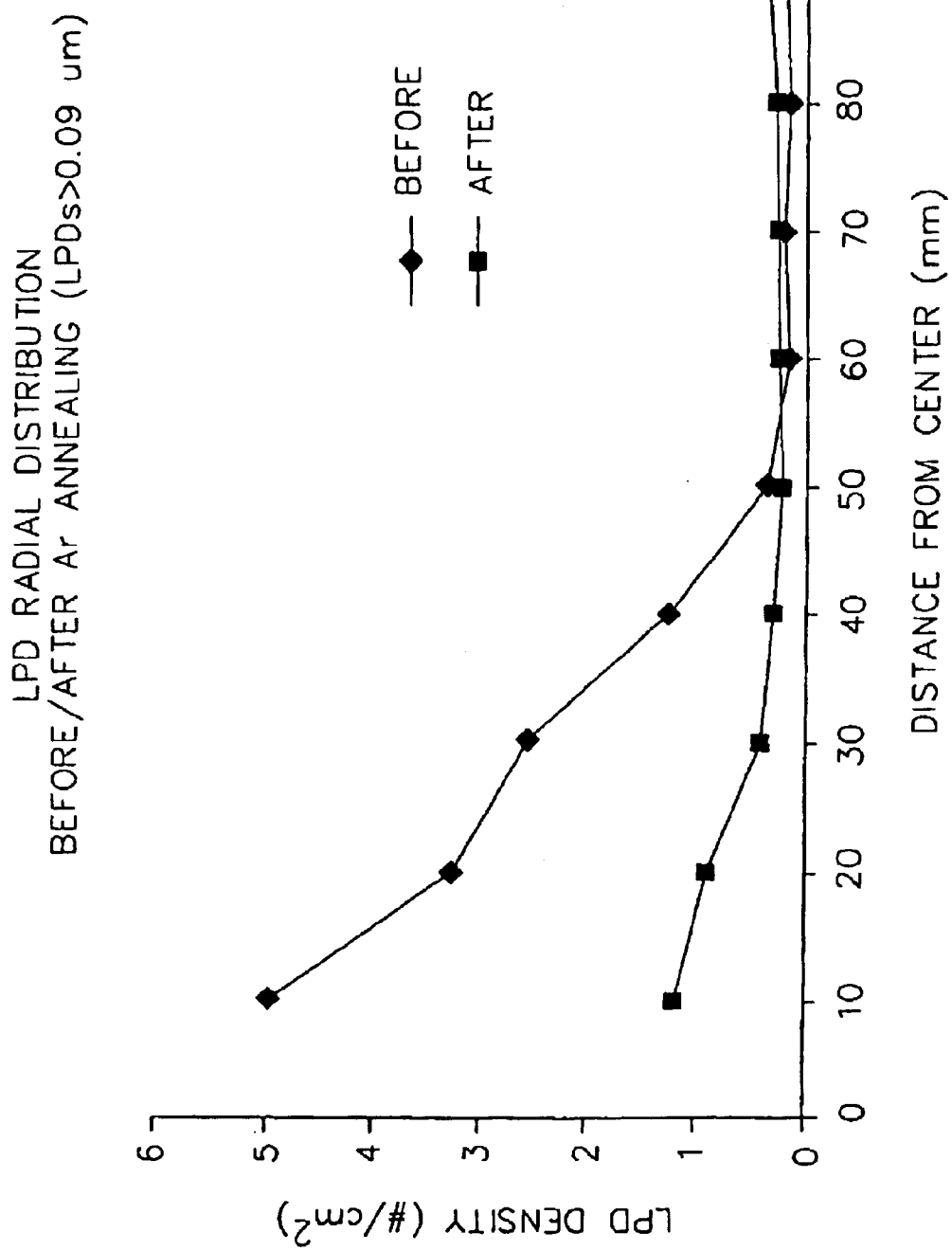
FIG. 26 is a graph illustrating the results of light .scatter defect analyses (defect size in excess of 0.09 microns) for single crystal silicon wafers before and after thermal anneal, as described in Example 8.
Figure 27:
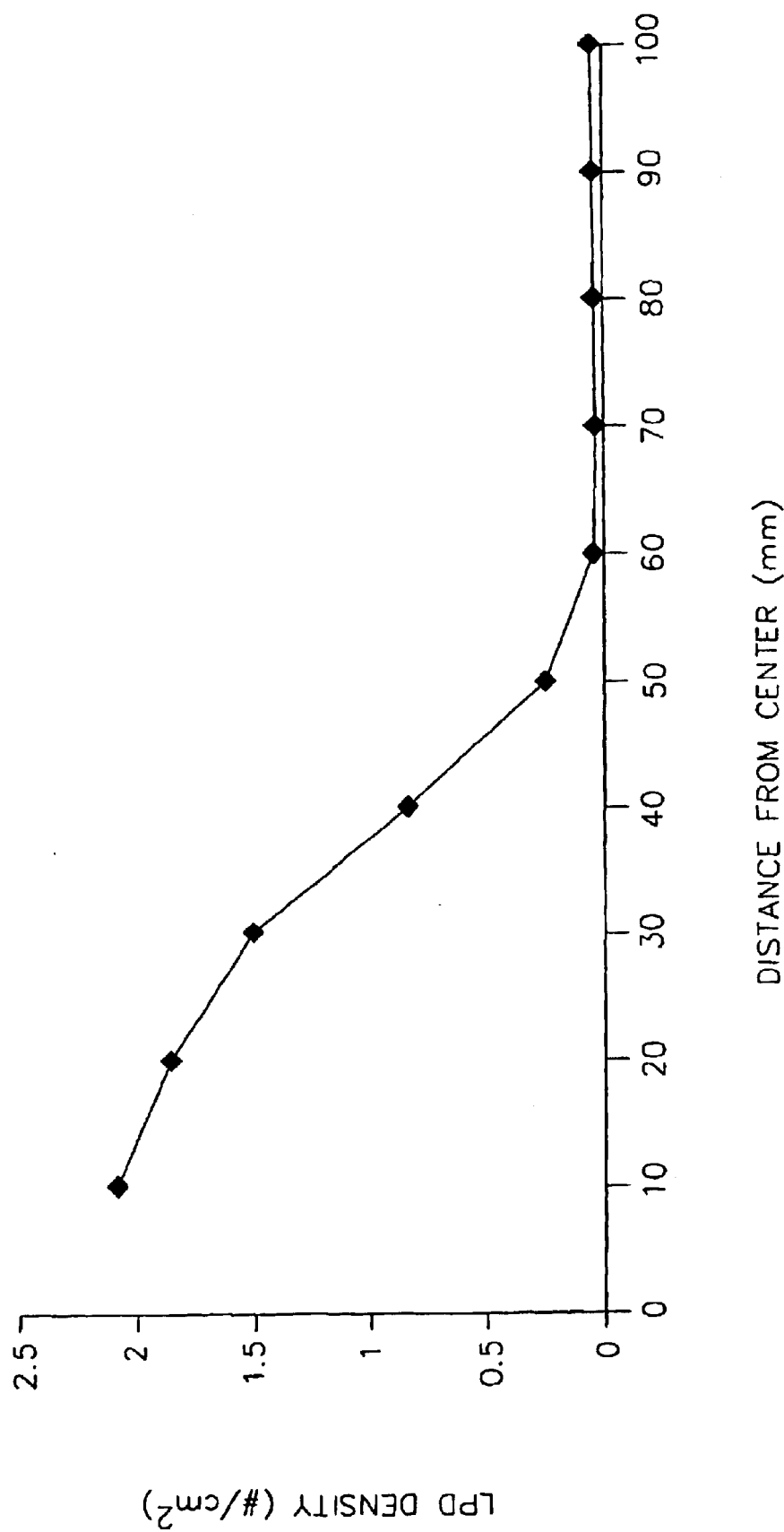
FIG. 27 is a graph illustrating the results of light scatter defect analyses (defect size between 0.09–0.11 If microns) for single crystal silicon wafers before thermal anneal, as described in Example 8.
Figure 28:
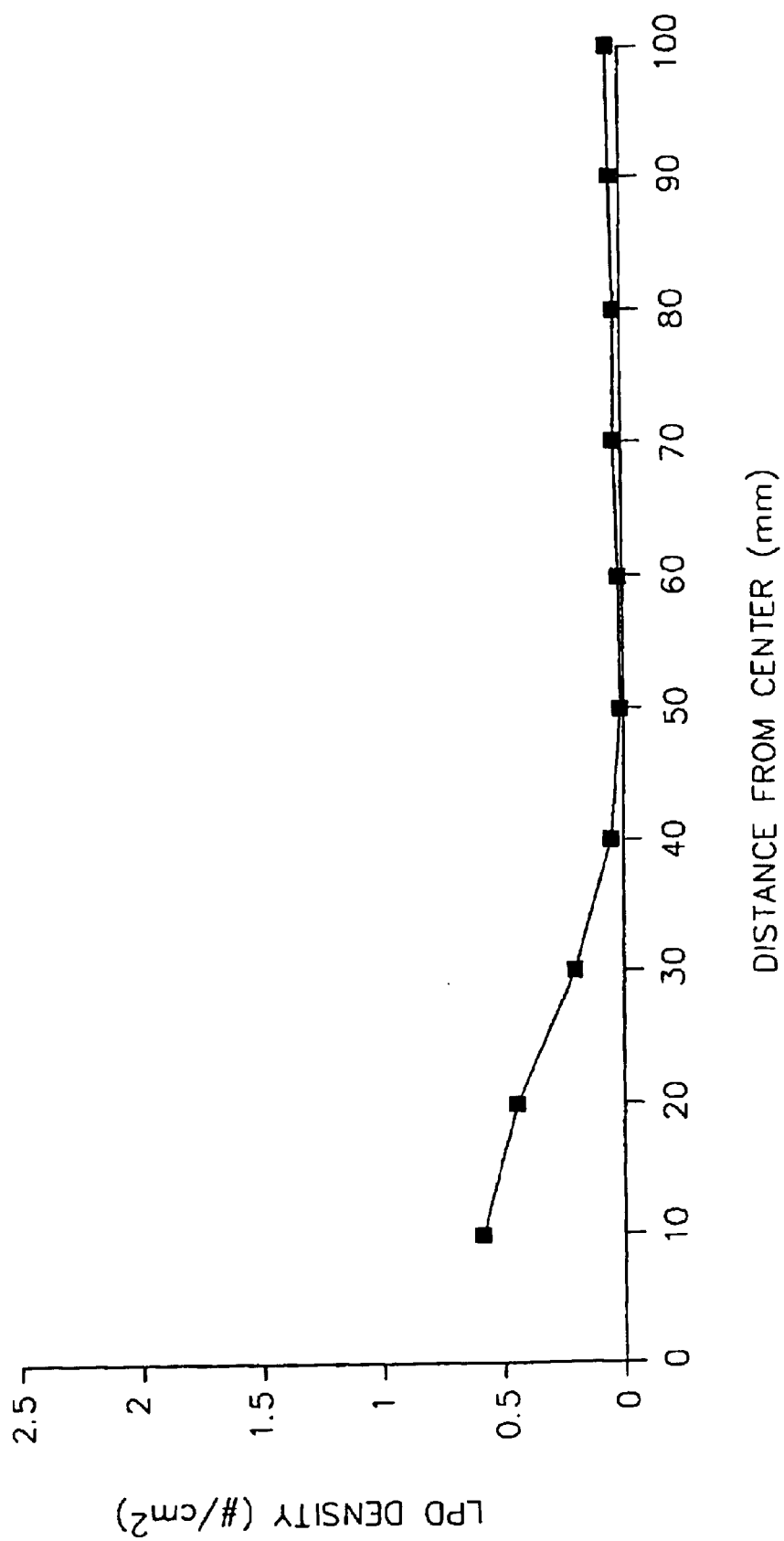
FIG. 28 is a graph illustrating the results of light scatter defect analyses (defect size between 0.09–0.11 microns) for single crystal silicon wafers after thermal anneal, as described in Example 8.
Figure 29:
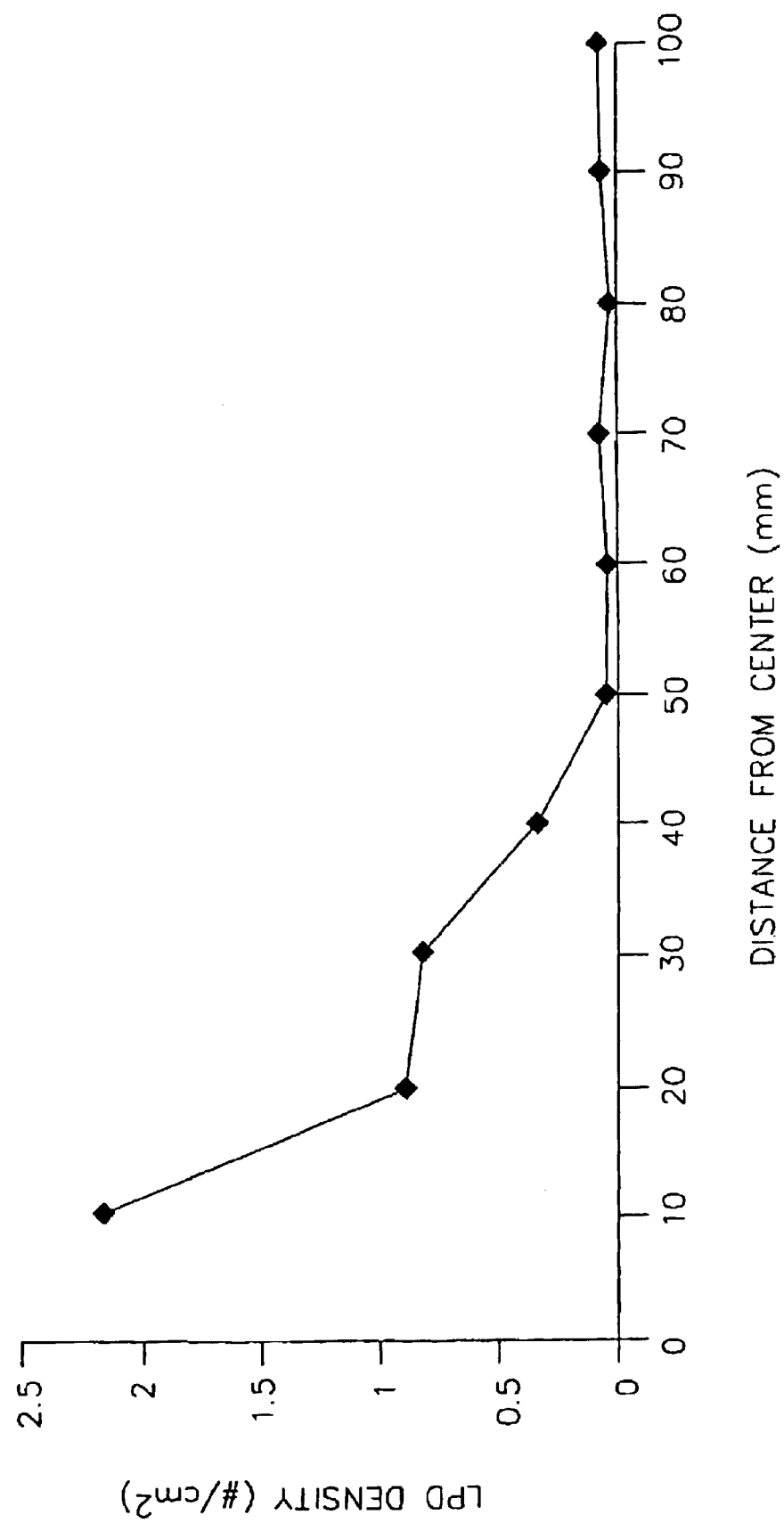
FIG. 29 is a graph illustrating the results of light scatter defect analyses (defect size between 0.11–0.13 microns) for single crystal silicon wafers before thermal anneal, as described in Example 8.
Figure 30:
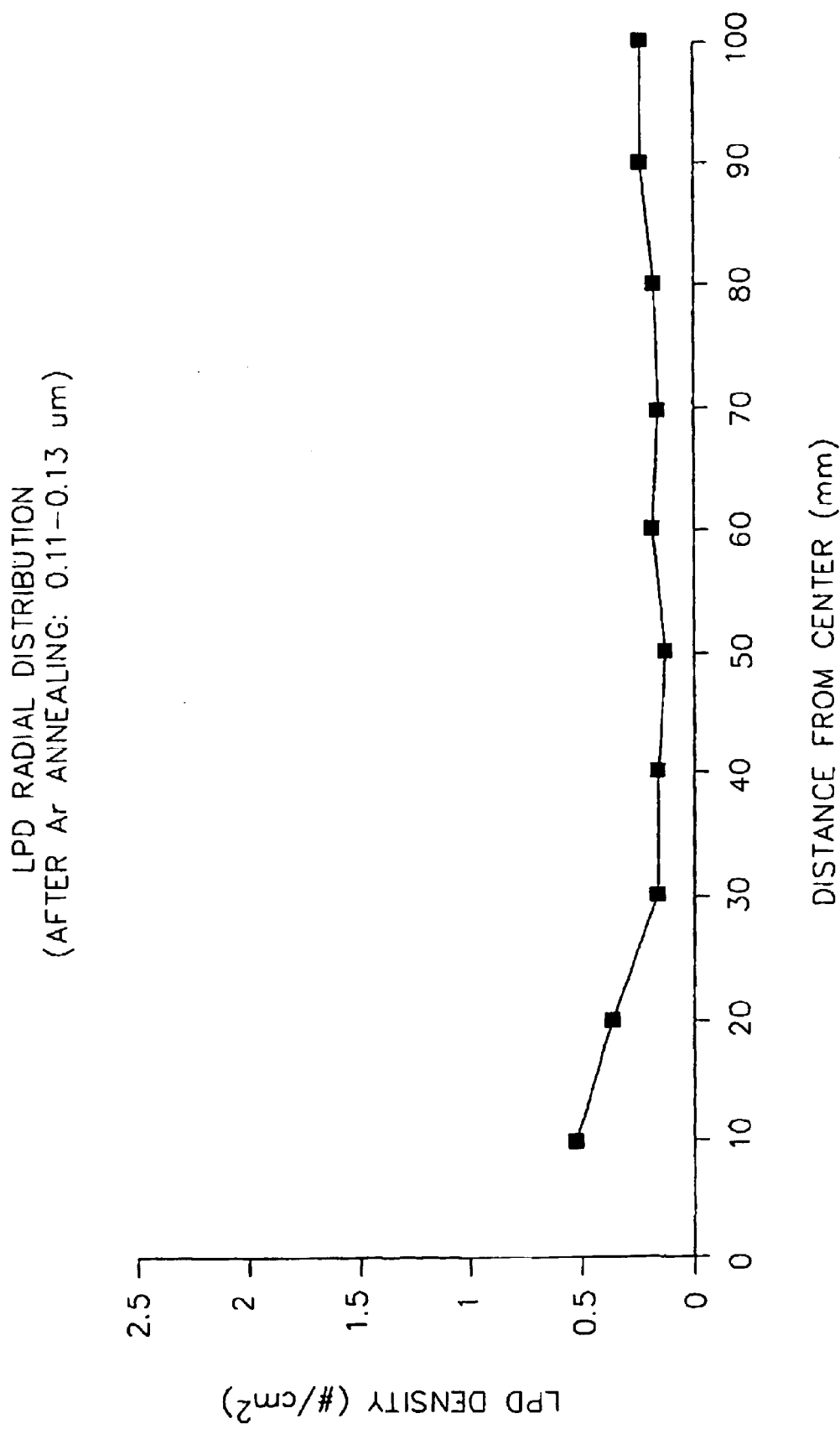
FIG. 30 is a graph illustrating the results of light scatter defect analyses (defect size between 0.11–0.13 microns) for single crystal silicon wafers after thermal anneal, as described in Example 8.
Figure 31:
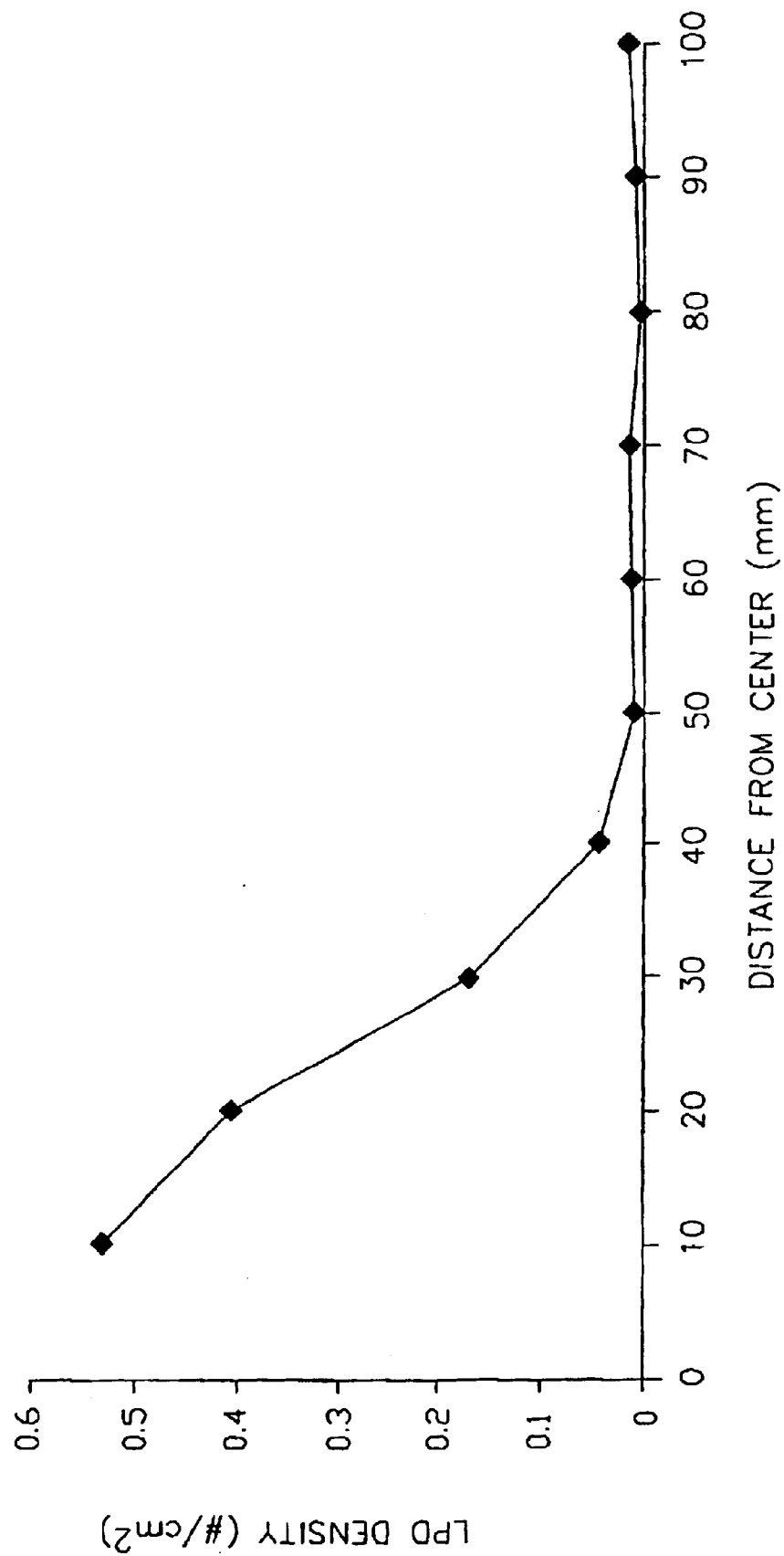
FIG. 31 is a graph illustrating the results of light scatter defect analyses (defect size between 0.13–0.15 microns) for single crystal silicon wafers before thermal anneal, as described in Example 8.
Figure 32:
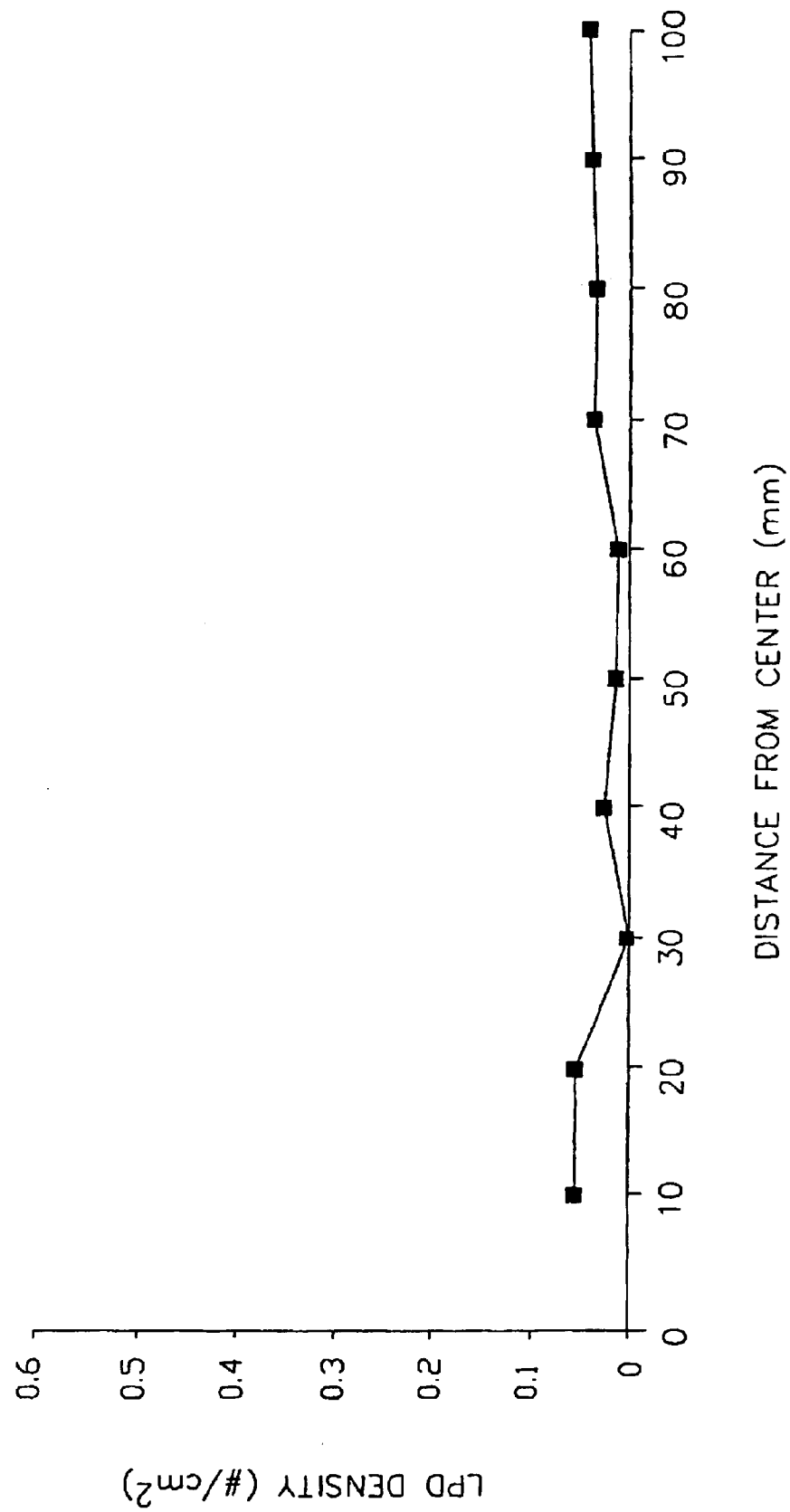
FIG. 32 is a graph illustrating the results of light scatter defect analyses (defect size between 0.13–0.15 microns) for single crystal silicon wafers after thermal anneal, as described in Example 8.

Referring now to FIG. 26, a number of 200 mm wafers obtained from the process of the present invention where analyzed by laser beam surface scanning equipment common in the art (see, e.g., Tencor SP1 laser scanner, commercially available from Tencor Inc. of Mountain View, Calif.) in order to determine the average number of light point defects (LPDs), including agglomerated vacancy defects, having a size greater than about 0.09 microns, present per square centimeter on the surface of the wafers. (The results of the analyses are presented as a function of the distance from the central axis of the wafers.) The wafers were then thermally annealed, the wafers being heated to about 1200° C. for about 2 hours. The wafers were then analyzed by the same method once again.

As the results indicate, the wafers initially contained an average of about 5 LPDs/cm$^2$ (light point defects per square centimeter) to about 0.2 LPD/cm² over a distance of about 50 mm from the central axis, the number decreasing as the distance from the central axis increases. However, after the thermal anneal was complete, the wafers contained an average of about 1 LPD/cm² to about 0.2 LPD/cm² within the same region. The results clearly show that within the axially symmetric region of the vacancy-type material, agglomerated vacancy defects were dissolved or reduced in size as a result of the thermal anneal. Within the region where the number of LPDs in excess of about 0.09 microns was the highest, that being the region extending from the central axis to about 10 mm, the size of the defects were reduced below 0.09 microns (i.e., the lower limit of the defect size being detected), effectively causing the number of defects within this size range to be reduced by about 80% (i.e., the number density was reduced by about 80%).

It is to be noted that, with regard to the number of defects detected per square centimeter, that the light scattering analysis also detects particulate and other defects present on the surface of the wafer which are not attributable to agglomerated vacancy defects. For example, the results indicate a number of LPDs are present at radial positions greater than about 50 mm. However, this material is interstitial-type and, therefore, does not contain agglomerated vacancy defects. Accordingly, while the results show LPDs are still present after the thermal anneal, it is to be understood that these defects may or may not be agglomerated vacancy defects which have withstood the thermal anneal.

Referring now to FIGS. 27 through 32, the initial and final results of the surface analyses are further divided by defect size. It may first be observed that the thermal anneal is successful in dissolving or reducing in size agglomerated vacancy defects ranging in size from about 0.09 microns up to about 0.15 microns. It may further be observed from these results that the majority of the LPDs detected were small, ranging in size from about 0.09 microns up to about 0.13 microns. Without being held to any particular theory, this is believed to be the case because the width of the vacancy core is generally small, extending over only about 50% of the radius. Accordingly, it is to be noted that preferably the width of the axially symmetric region substantially free of agglomerated interstitial defects is at least about 50% of the radius of the wafer, in order to ensure agglomerated vacancy defects (if present) are more easily dissolved; that is, preferably the width of the vacancy core will be less than about 50% of the radius of the wafer.

Figure 33A:
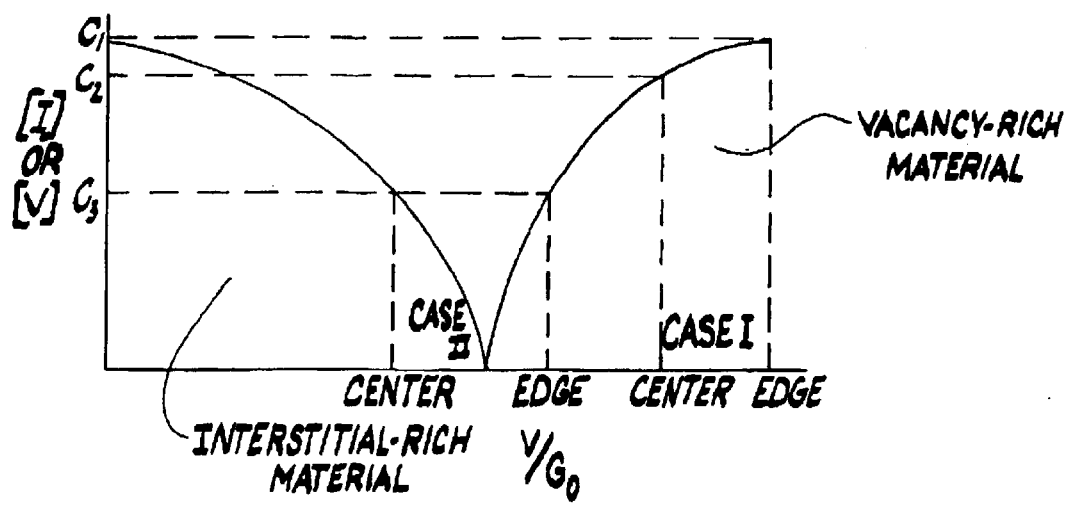
FIGS. 33a through 33c are graphs illustrating the relationship between v/G₀ and the width of the vacancy core within the single crystal silicon, as well as the concentration of intrinsic point defects within the core.
Figure 33B:
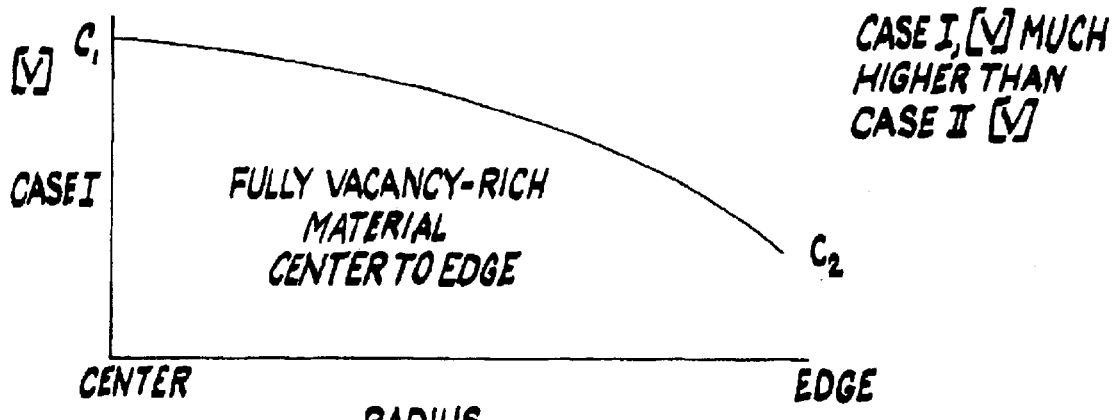
Figure 33C:
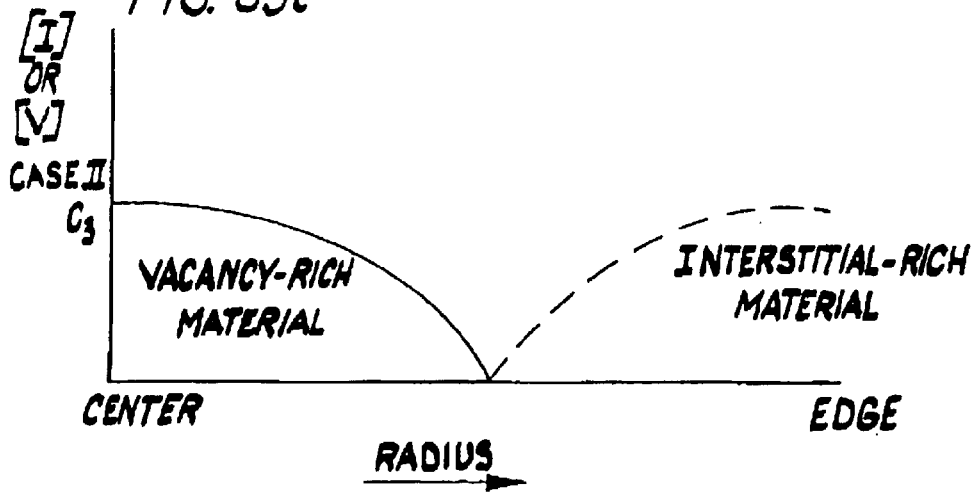

Referring now to FIGS. 33a through 33b, it may be observed that when the single crystal silicon material is grown to be vacancy-dominated from center to edge (denoted "case I"; see FIGS. 33a and 33b), the resulting vacancy concentration in the material is very high, as compared to material prepared in accordance with the present invention (denoted "case II"; see FIGS. 33a and 33c). Material prepared by the present process to have a vacancy core of minimal width has a much lower concentration of vacancy intrinsic point defects and, therefore, the resulting size of the agglomerated defects, if formed, are much smaller. As can be seen from FIGS. 27 through 30, smaller defects are more easily dissolved.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

What is claimed is:

1. A process for preparing a single crystal silicon wafer, the process comprising thermally annealing a single crystal silicon wafer at a temperature in excess of about 1000° C. in an atmosphere of hydrogen, argon, oxygen nitrogen, or a mixture thereof, said wafer having a central axis, a front side and a back side which are generally perpendicular to the central axis, a central plane between the front and back sides, a circumferential edge, a radius extending from the central axis to the circumferential edge, a first axially symmetric region extending radially inward from the circumferential edge in which silicon self-interstitials are the predominant intrinsic point defect and which is substantially free of agglomerated interstitial defects, a second axially symmetric region, located radially inward of the first axially symmetric region, in which vacancies are the predominant intrinsic point defect and which is substantially free of agglomerated vacancy defects, and a third axially symmetric region, located radially inward of the second axially symmetric region, which comprises agglomerated vacancy defects, the thermal anneal acting to dissolve agglomerated vacancy defects present in the third axially symmetric region within a layer extending from the front side toward the central plane.

2. The process as set forth in claim 1 wherein the wafer is thermally annealed in an argon atmosphere.

3. The process as set forth in claim 1 wherein the wafer is thermally annealed by heating the wafer to a temperature ranging from about 1100 to about 1300° C.

4. The process as set forth in claim 3 wherein the wafer is thermally annealed for about 1 to about 4 hours.

5. The process as set forth in claim 1 wherein the wafer is thermally annealed by heating the wafer to a temperature ranging from about 1200 to about 1250° C.

6. The process as set forth in claim 5 wherein the wafer is thermally annealed for about 2 to about 3 hours.

7. The process as set forth in claim 1 wherein the layer extends from the front side and toward the central plane to a depth of about 4 microns.

8. The process as set forth in claim 1 wherein the layer extends from the front side and towards the central plane to a depth of about 8 microns.

9. The process as set forth in claim 1 wherein the layer extends from the front side and towards the central plane to a depth of about 10 micros.

10. The process as set forth in claim 1 wherein the layer extends from the front side and towards the central plane to a depth of about 20 microns.

11. The process as set forth in claim 1 wherein the first axially symmetric region has a width, as measured from the circumferential edge radially toward the center axis, which is at least about 10% the length of the radius.

12. The process as set forth in claim 1 wherein the first axially symmetric region has a width, as measured from the circumferential edge radially toward the center axis, which is at least about 30% the length of the radius.

13. The process as set forth in claim 1 wherein the first axially symmetric region has a width, as measured from the circumferential edge radially toward the center axis, which is at least about 60% the length of the radius.

14. The process as set forth in claim 1 wherein the first axially symmetric region has a width, as measured from the circumferential edge radially toward the center axis, which is at least about 80% the length of the radius.

15. The process as set forth in claim 1 wherein the wafer has a diameter of at least about 150 mm.

16. The process as set forth in claim 1 wherein the wafer has a diameter of at least about 200 mm.

17. The process as set forth in claim 1 wherein the wafer is sliced from a single crystal silicon ingot grown and cooled in accordance with the Czochralski method, such that as part of the cooling process the ingot is cooled at a cooling rate which ranges from about 0.1 to about 3.0° C./min.

18. The process as set forth in claim 17 wherein as part of the cooling process the ingot is cooled through a temperature rate from the solidification temperature of silicon to about 800° C. at a cooling rate which ranges from about 0.1 to about 3.0° C./min.

19. The process as set forth in claim 18 wherein the cooling rate ranges from about 0.1 to about 1.5° C./min.

20. The process as set forth in claim 18 wherein the cooling rate ranges from about 0.1 to about 1.0° C./min.

21. The process as set forth in claim 18 wherein the cooling rate ranges from about 0.1 to about 0.5° C./min.

22. The process as set forth in claim 1 wherein the wafer has a diameter of at least about 300 mm.

23. The process as set forth in claim 1 wherein the second axially symmetric region has a width of at least about 7.5% of the radius of the wafer.

24. The process as sat forth in claim 1 wherein the second axially symmetric region has a width of at least about 15% of the radius of the wafer.

25. The process as set forth in claim 1 wherein the second axially symmetric region has a width of at least about 25% of the radius of the wafer.

26. The process as set forth in claim 1 wherein the second axially symmetric region has a width of at least about 50% of the radius of the wafer.

27. A process for preparing a silicon wafer having a surface layer which is substantially free of agglomerated intrinsic point defects, the wafer being sliced from a single crystal silicon ingot having a central axis, a seed-cone, an end-cone, and a constant diameter portion which extends between the seed-cone and the end-cone, the constant diameter portion having a circumferential edge and a radius extending from the circumferential edge toward the central axis, the ingot being grown from a silicon melt and then cooled from the solidification temperature in accordance with the Czochralski method, the process comprising:

growing the single crystal silicon ingot wherein the growth velocity, v, and an average axial temperature gradient, $G_0$, are controlled during the growth of the constant diameter portion of the ingot over a temperature range from solidification to a temperature of no less than about 1325° C. to cause the formation of a segment of the constant diameter portion which, upon cooling of the ingot from the solidification temperature, comprises a first axially symmetrical region extending radially inward from the circumferential edge toward the central axis in which silicon self-interstitials are the predominant intrinsic point defect and which is substantially free of agglomerated interstitial defects, and a second axially symmetric region in which vacancies are the predominant intrinsic point defect, wherein, as part of the cooling process, the ingot is cooled through a temperature range from the solidification temperature of silicon to about 800° C. at a cooling rate which ranges from about 0.1 to about 1.5 C./min;

slicing the segment of the constant diameter portion to obtain a wafer, the wafer having a front side and a back side which are generally perpendicular to the central axis, and a central plane between the front and back sides, the wafer comprising the first and second axially symmetric regions; and, thermally annealing the wafer at a temperature in excess of about 1000° C. in an atmosphere of hydrogen, argon, oxygen, nitrogen, or a mixture thereof to dissolve agglomerated vacancy defects present in the second axially symmetric region within a layer extending from the front surface toward the central plane of the wafer such that the layer is substantially free of agglomerated intrinsic point defects.

28. The process as set forth in claim 27 wherein the wafer is thermally annealed in an argon atmosphere.

29. The process as set forth in claim 27 wherein the wafer is thermally annealed by heating the wafer to a temperature ranging from about 1100 to about 1300° C.

30. The process as set forth in claim 29 wherein the wafer is thermally annealed for about 1 to about 4 hours.

31. The process as set forth in claim 27 wherein the layer extends from the front side and toward the central plane to a depth of at least about 4 micros.

32. The process as set forth in claim 27 wherein the first axially symmetric region has a width, as measured from the circumferential edge radially toward the center axis, which is at least about 60% the length of the radius.

33. The process as set forth in claim 27 wherein the cooling rate ranges from about 0.1 to about 1.0° C./min.

34. The process as set forth in claim 27 wherein the cooling rate ranges from about 0.1 to about 0.5° C./min.

35. The process as set fort in claim 27 wherein the wafer has a diameter of at least about 300 mm.

36. A process for preparing a single crystal silicon wafer having a surface layer which is substantially free of agglomerated intrinsic point defects, the process comprising thermally annealing a single crystal silicon wafer at a temperature in excess of about 1000° C. in an atmosphere of hydrogen, argon, oxygen, nitrogen, or a mixture thereof, said wafer having been sliced from a single crystal silicon ingot grown and cooled in accordance with the Czochralski method wherein, as part of the cooling process, the ingot was cooled through a temperature range from the solidification temperature of silicon to about 800° C. at a cooling rate which ranges from about 0.1 to about 1.5° C./min, and said wafer having a central axis, a front side and a back side which are generally perpendicular to the central axis, a central plane between the front and back sides, a circumferential edge, a radius extending from the central axis to the circumferential edge, a first axially symmetric region extending radially inward from the circumferential edge in which silicon self-interstitials are the predominant intrinsic point defect and which is substantially free of agglomerated interstitial defects, and a second axially symmetric region, located radially inward of the first axially symmetric resion, in which vacancies are the predominant intrinsic point defect, the thermal anneal acting to dissolve agglomerated vacancy defects present in the second axially symmetric region within a layer extending from the front side toward the central plane such that the layer is substantially free of agglomerated intrinsic point defects.

37. The process as set forth in claim 36 wherein the wafer is thermally annealed in an argon atmosphere.

38. The process as set forth in claim 36 wherein the wafer is thermally annealed by heating the wafer to a temperature ranging from about 1100 to about 1300° C.

39. The process as set forth in claim 38 wherein the wafer is thermally annealed for about 1 to about 4 hours.

40. The process as set forth in claim 36 wherein the wafer is thermally annealed by heating the wafer to a temperature ranging from about 1200 to about 1250° C.

41. The process as set forth in claim 40 wherein the wafer is thermally annealed for about 2 to about 3 hours.

42. The process as set forth in claim 36 wherein the layer extends from the front side and toward the central plane to a depth of about 4 microns.

43. The process as set forth in claim 36 wherein the layer extends from the front side and towards the central plane to a depth of about 8 microns.

44. The process as set forth in claim 36 wherein the layer extends from the front side and towards the central plane to a depth of about 10 microns.

45. The process as set forth in claim 36 wherein the layer extends from the front side and towards the central plane to a depth of about 20 microns.

46. The process as set forth in claim 36 wherein the first axially symmetric region has a width, as measured from the circumferential edge radially toward the center axis, which is at least about 10% the length of the radius.

47. The process as set forth in claim 36 wherein the first axially symmetric region has a width, as measured from the circumferential edge radially toward the center axis, which is at least about 30% the length of the radius.

48. The process as set forth in claim 36 wherein the fist axially symmetric region has a width, as measured from the circumferential edge radially toward the center axis, which is at least about 60% the length of the radius.

49. The process as set forth in claim 36 wherein the first axially symmetric region has a width, as measured from the circumferential edge radially toward the center axis, which is at least about 80% the length of the radius.

50. The process as set forth in claim 36 wherein the wafer has a diameter of at least about 150 mm.

51. The process as set forth in claim 36 wherein the wafer has a diameter of at least about 200 mm.

52. The process as set forth in claim 36 wherein the wafer has a diameter of at least about 300 mm.

53. The process as set forth in claim 36 wherein the cooling rate ranges from about 0.1 to about 1.0° C./min.

54. The process as set forth in claim 36 wherein the cooling rate ranges from about 0.1 to about 0.5° C./min.

* * * * *